US007990231B2

(12) United States Patent
Morikaku et al.

(10) Patent No.: US 7,990,231 B2
(45) Date of Patent: Aug. 2, 2011

(54) DELAY LINE

(75) Inventors: Hiroyuki Morikaku, Saku (JP); Itsuaki Katsumata, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 492 days.

(21) Appl. No.: 11/815,815

(22) PCT Filed: Mar. 10, 2006

(86) PCT No.: PCT/JP2006/304778

§ 371 (c)(1), (2), (4) Date: Aug. 8, 2007

(87) PCT Pub. No.: WO2006/095865

PCT Pub. Date: Sep. 14, 2006

(65) Prior Publication Data

US 2009/0051465 A1 Feb. 26, 2009

(30) Foreign Application Priority Data

Mar. 10, 2005 (JP) ................................ 2005-067705

(51) Int. Cl.
*H03H 7/30* (2006.01)
*H01P 3/08* (2006.01)

(52) U.S. Cl. ......................... 333/175; 333/138; 333/204

(58) Field of Classification Search .................. 333/139, 333/140, 175, 138, 204
See application file for complete search history.

(56) References Cited

U.S. PATENT DOCUMENTS 3,609,601 A 9/1971 Phillips et al.
5,625,894 A * 4/1997 Jou ................................ 455/78
5,892,415 A * 4/1999 Okamura ...................... 333/175
6,317,013 B1 * 11/2001 Hershtig ...................... 333/118
6,801,102 B2 * 10/2004 Shamsaifar et al. .......... 333/174
6,975,186 B2 * 12/2005 Hirabayashi .................. 333/204
7,109,829 B2 * 9/2006 Kosaka et al. ................ 333/204
7,468,642 B2 * 12/2008 Bavisi et al. .................. 333/168

FOREIGN PATENT DOCUMENTS

JP 51-078673 A1 7/1976
JP 64-037101 A1 2/1989
JP 03-038105 2/1991
JP 5-048401 U1 6/1993
JP 07-058511 A1 3/1995

(Continued)

OTHER PUBLICATIONS

Koizumi, Katsuo "Design Technique for High-Frequency Band Filter" Transistor Gijutsu. Feb. 1998 p. 403-412 (with a partial English translation).

*Primary Examiner* — Robert Pascal
*Assistant Examiner* — Alan Wong
(74) *Attorney, Agent, or Firm* — Burr & Brown

(57) ABSTRACT

In a band-pass filter of a delay line, an input terminal and a first resonator adjacent to the input terminal are coupled through a capacitor. The first resonator and a second resonator adjacent to the first resonator are coupled through a capacitor. The second resonator and a third resonator adjacent to the second resonator are coupled through an inductance. The third resonator and a fourth resonator adjacent to the third resonator are coupled through a capacitor. The fourth resonator and an output terminal adjacent to the fourth resonator are coupled through a capacitor.

2 Claims, 29 Drawing Sheets

FOREIGN PATENT DOCUMENTS

| | | | |
|---|---|---|---|
| JP | 07-170108 | A1 | 7/1995 |
| JP | 08-186406 | A1 | 7/1996 |
| JP | 08-330807 | A1 | 12/1996 |
| JP | 10-028005 | A1 | 1/1998 |
| JP | 11-041006 | | 2/1999 |
| JP | 2001-085914 | A1 | 3/2001 |
| JP | 2001-257505 | A1 | 9/2001 |
| JP | 2003-273661 | A1 | 9/2003 |

* cited by examiner

101

10K

DELAY LINE

TECHNICAL FIELD

The present invention relates to a delay line including a parallel resonance circuit which has a plurality of resonators between an input terminal and an output terminal.

BACKGROUND OF THE INVENTION

Recently, distortion-compensation amplifiers for reducing distortions in base stations, which are used in base station wireless apparatus such as of mobile communication systems or the like, employ a delay line for the purposes of detecting and suppressing distortions.

As shown in FIG. 27, for example, a delay line 200 includes a bandpass filter 208 having an input terminal 202, an output terminal 204, and a plurality of resonators 206A through 206I. The input terminal 202 and the resonator 206A in the first stage are connected to each other by a capacitor C1, and the output terminal 204 and the resonator 206I in the final stage are connected to each other by a capacitor C2. The resonators 206A through 206I are connected by capacitors C3 through C10.

Heretofore, as shown in FIG. 28, there has been known a delay line 210 that is similar to the delay line 200 shown in FIG. 27, in which a skipping circuit 212 is connected parallel to coupling capacitors C3 through C8 between adjacent resonators 206A through 206G and has a plurality of coupling capacitors C9 through C19 (see, for example, Patent Document 1), and, as shown in FIG. 29, there has been known a delay line 300 in which a skipping circuit 302 is connected parallel to coupling capacitors C1 through C6 between adjacent resonators 206A through 206E and has coupling capacitors C7 through C10 and inductors L1 through L7 (see, for example, Patent Document 2).

The examples shown in FIGS. 28 and 29 are advantageous in that the flatness of the group delay time in the passband of the bandpass filter 208 can be maintained and the group delay time deviation can be reduced without involving an increase in the number of resonator stages.

Patent Document 1: Japanese Laid-Open Patent Publication No. 2001-257505

Patent Document 1: Japanese Laid-Open Patent Publication No. 2003-273661

SUMMARY OF THE INVENTION

The delay line 210 shown in FIG. 28 and the delay line 300 shown in FIG. 29 are capable of maintaining the flatness of the group delay time in the passband and reducing the group delay time deviation without involving an increase in the number of resonator stages. However, they are problematic in that the number of circuit components of the skipping circuits 212, 302 is large, or the number of the skipping circuits 212, 302 is large, resulting in an increase in the size. Another problem is that the amount of delay essentially remains unchanged compared with the delay line 200 shown in FIG. 27 which is free of the skipping circuits 212, 302.

The present invention has been made in view of the above problems. It is an object of the present invention to provide a delay line which is of a simple arrangement, is capable of maintaining the flatness of the group delay time in the passband (i.e., maintaining the flatness of the group delay time in the passband and reducing the group delay time deviation in the passband), and can be reduced in size.

Another object of the present invention is to provide a delay line which is of a simple arrangement, is capable of acquiring a large amount of delay and of maintaining the flatness of the group delay time in the passband, and can be reduced in size.

A delay line according to the present invention includes a bandpass filter which has a plurality of resonators between an input terminal and an output terminal, wherein the input terminal and one of the resonators which is adjacent to the input terminal are connected to each other by a capacitive coupling or an inductive-coupling, the output terminal and one of the resonators which is adjacent to the output terminal are connected to each other by a capacitive coupling or an inductive-coupling, the resonators are connected to each other by a capacitive coupling and/or an inductive-coupling, and the couplings comprise at least one capacitive coupling and at least one inductive-coupling. A combination of the capacitive couplings and the inductive-couplings may be symmetrically arranged.

If resonators are coupled by a capacitive coupling only, then in terms of delay characteristics, the peak value of the group delay time in a capacitive range (low-frequency range) is greater than the peak value of the group delay time in an inductive range (high-frequency range), so that no flatness of the group delay time in the passband and no reduction in the group delay time deviation in the passband can be achieved.

The flatness of the group delay time in the passband means that flatness is achieved as a line segment interconnecting the maximum value of the group delay time in the low-frequency range of the passband and the maximum value of the group delay time in the high-frequency range of the passband is closer to a horizontal line. Therefore, as the peak value of the group delay time in the capacitive range (low-frequency range) and the peak value of the group delay time in the inductive range (high-frequency range) are closer to each other, the flatness of the group delay time in the passband is achieved.

The group delay time deviation in the passband represents the difference between the maximum value (a greater one of the maximum value of the group delay time in the low-frequency range and the maximum value of the group delay time in the high-frequency range) and the minimum value of the group delay time in the passband. Therefore, the group delay time deviation in the passband can be reduced by reducing the maximum value of the group delay time in the passband and/or increasing the minimum value of the group delay time in the passband.

If resonators are coupled by an inductive coupling only, then in terms of delay characteristics, the peak value of the group delay time in the capacitive range (low-frequency range) is smaller than the peak value of the group delay time in the inductive range (high-frequency range), so that no flatness of the group delay time and no reduction in the group delay time deviation in the passband can be achieved.

According to the present invention, the input terminal and one of the resonators which is adjacent to the input terminal are connected to each other by a capacitive coupling or an inductive-coupling, the output terminal and one of the resonators which is adjacent to the output terminal are connected to each other by a capacitive coupling or an inductive-coupling, the resonators are connected to each other by a capacitive coupling and/or an inductive-coupling, and the combination of the capacitive couplings and the inductive-couplings is symmetrically arranged. Consequently, in terms of delay characteristics, the peak value of the group delay time in the low-frequency range and the peak value of the group delay time in the high-frequency range are substantially the same as each other, so that the flatness of the group delay time in the passband can be maintained and the group delay time deviation in the passband can be reduced.

According to the present invention, therefore, the delay line is of a simple arrangement, is capable of maintaining the flatness of the group delay time in the passband, and can be reduced in size.

In the above arrangement, the delay line may include at least one combination of a single resonator and a resonator adjacent to the single resonator that are coupled to each other by a composite coupling configuration including at least one capacitive coupling and at least one inductive coupling.

In the above arrangement, the delay line may further comprise at least one additional circuit connecting two of the plurality of resonators across at least one resonator by a composite coupling configuration including at least one capacitive coupling and at least one inductive coupling.

According to the present invention, the delay line is of a simple arrangement, is capable of acquiring a large amount of delay (group delay time) and of maintaining the flatness of the group delay time in the passband, and can be reduced in size. The delay line is suitable for use as a delay line in distortion-compensation amplifiers.

With the conventional delay lines (see FIGS. 28 and 29), the peak value of the delay characteristics is reduced by an additional circuit for maintaining the flatness of the group delay time in the passband. Therefore, it is impossible to increase dips (where the amount of delay is the smallest) in the delay characteristics of the bandpass filter.

According to the present invention, for increasing dips in the delay characteristics (also possibly reducing the difference between the peak values), rather than changing the peak values of the delay characteristics, the delay line includes at least one combination in which a single resonator and a resonator adjacent to the single resonator are coupled to each other by a composite coupling configuration including at least one capacitive coupling and at least one inductive coupling, or includes at least one additional circuit connecting two of the plurality of resonators across at least one resonator by a composite coupling configuration including at least one capacitive coupling and at least one inductive coupling.

Consequently, unlike the conventional delay lines, a greater amount of delay can be obtained in the dips of the delay characteristics of the bandpass filter. In some cases, it is possible to increase the amount of delay to a level equal to or higher than the peak values of the delay characteristics.

Each of the resonators may comprise one of a λ/4 resonator, a λ/2 resonator, and an LC resonance circuit.

As described above, the delay line according to the present invention is of a simple arrangement, is capable of maintaining the flatness of the group delay time in the passband, and can be reduced in size.

Furthermore, delay line according to the present invention is of a simple arrangement, is capable of acquiring a large amount of delay and of maintaining the flatness of the group delay time in the passband, and can be reduced in size.

DETAILED DESCRIPTION OF THE INVENTION

Embodiments of delay lines according to the present invention will be described below with reference to FIGS. 1 through 26.

Figure 1:
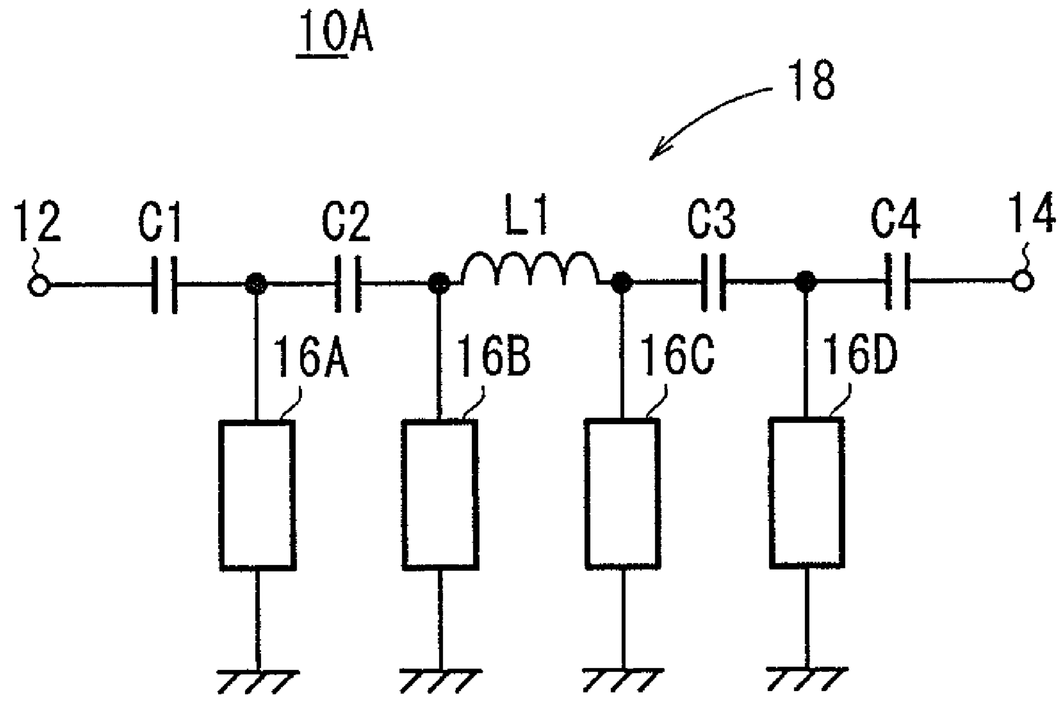
FIG. 1 is a circuit diagram showing a delay line according to a first embodiment.

As shown in FIG. 1, a delay line 10A according to a first embodiment of the present invention includes an input terminal 12, an output terminal 14, and a bandpass filter 18 having a plurality of λ/4 resonators (first through fourth resonators 16A through 16D) electrically connected between the input terminal 12 and the output terminal 14. The bandpass filter 18 has at least one coupled configuration in which a capacitor-coupled resonator and another adjacent resonator are induction-coupled to each other.

Specifically, in the bandpass filter 18, the input terminal 12 and the first resonator 16A adjacent to the input terminal 12 are coupled to each other by a capacitor C1, and the first resonator 16A and the second resonator 16B adjacent to the first resonator 16A are coupled to each other by a capacitor C2. The second resonator 16B and the third resonator 16C adjacent to the second resonator 16B are induction-coupled by an inductor L1, and the third resonator 16C and the fourth resonator 16D adjacent to the third resonator 16C are coupled to each other by a capacitor C3. The fourth resonator 16D and the output terminal 14 adjacent to the fourth resonator 16D are coupled to each other by a capacitor C4. Thus, the combination of the four capacitive couplings (the capacitors C1 through C4) and the single inductive coupling (the inductor L1) is symmetrically arranged.

Figure 2:
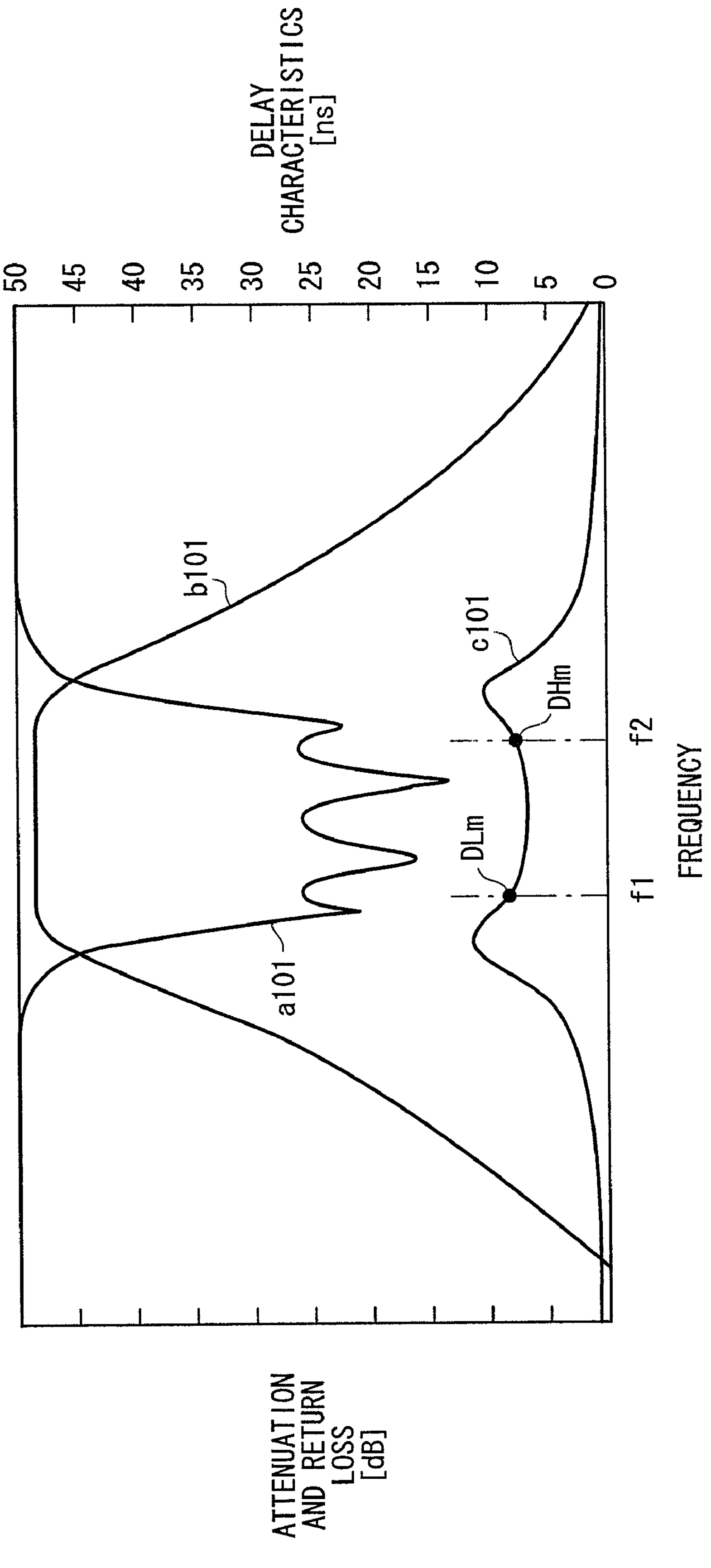
FIG. 2 is a diagram showing changes in the return loss with respect to the frequency, the attenuation characteristics, and the delay characteristics of the delay line according to the first embodiment.

FIG. 2 shows changes in the return loss with respect to the frequency, the attenuation characteristics, and the delay characteristics of the delay line 10A according to the first embodiment. In FIG. 2, a curve a101 represents changes in the return loss, a curve b101 the attenuation characteristics, and a curve c101 the delay characteristics.

Specific numerical values of the delay characteristics are as follows: The maximum value DLm of the group delay time in a low-frequency range of the passband is 7.6 ns (frequency f1), and the maximum value DHm of the group delay time in a high-frequency range of the passband is 7.4 ns (frequency f2), with the difference (flatness) therebetween being 0.2 ns. Since the minimum value in the passband is 6.8 ns, the group delay time deviation in the passband is 0.8 ns.

Operation and advantages of the delay line 10A according to the first embodiment will be described below in comparison with two comparative examples (a delay line 100A according to a first comparative example and a delay line 100B according to a second comparative example).

Figure 3:
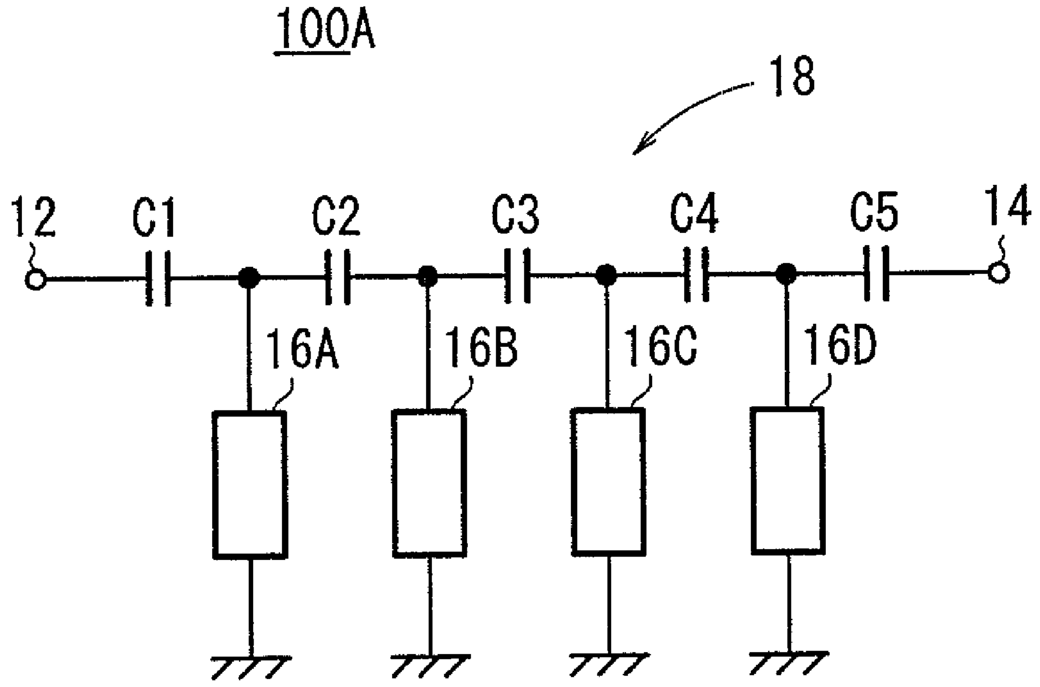
FIG. 3 is a circuit diagram showing a delay line according to a first comparative example.

As shown in FIG. 3, the delay line 100A according to the first comparative example includes a bandpass filter 18 wherein the input terminal 12 and the first resonator 16A, the fourth resonator 16D and the output terminal 14, and the first through fourth resonators 16A through 16D are coupled by respective capacitors C1, C2, C3, C4, C5.

Figure 4:
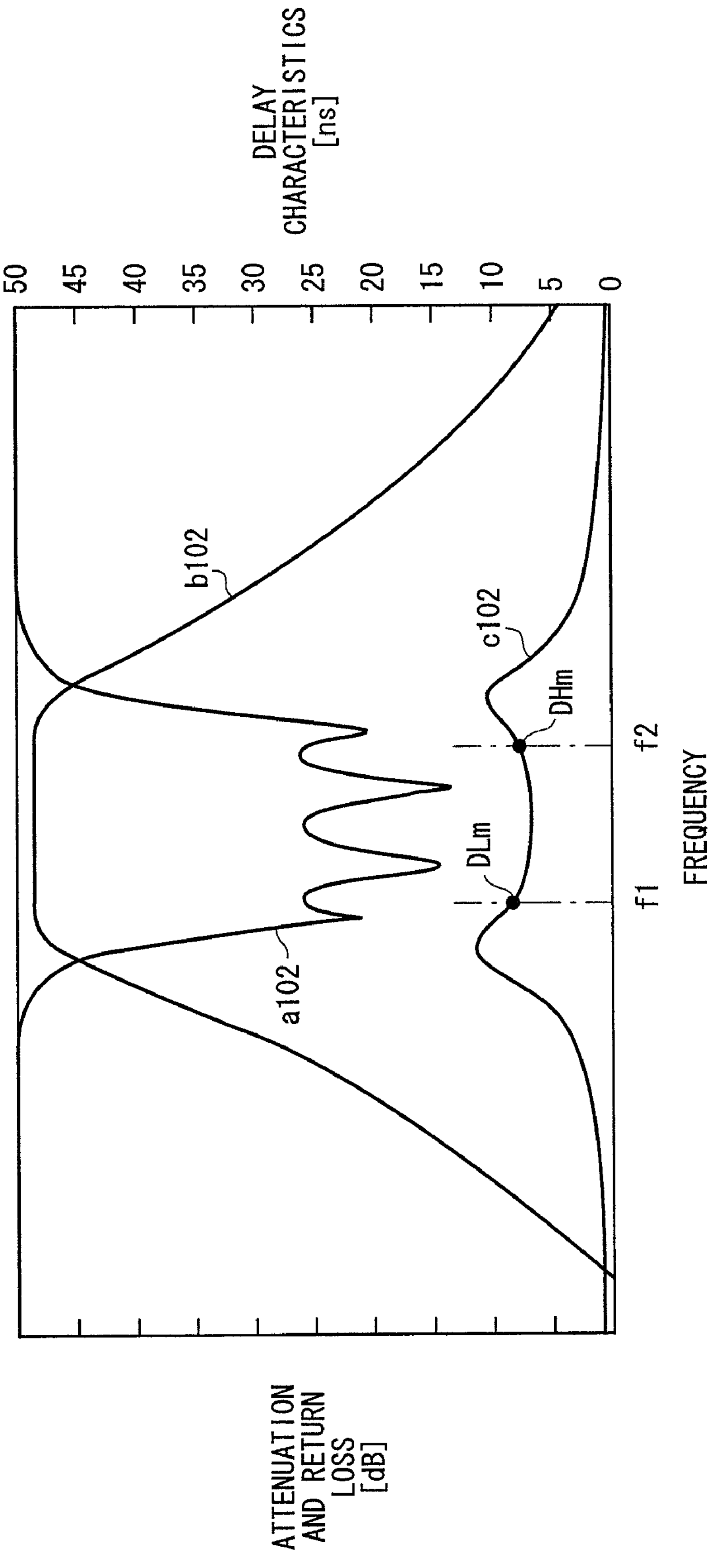
FIG. 4 is a diagram showing changes in the return loss with respect to the frequency, the attenuation characteristics, and the delay characteristics of the delay line according to the first comparative example.

FIG. 4 shows changes in the return loss with respect to the frequency, the attenuation characteristics, and the delay characteristics of the delay line 100A according to the first comparative example. In FIG. 4, a curve a102 represents changes in the return loss, a curve b102 the attenuation characteristics, and a curve c102 the delay characteristics.

Specific numerical values of the delay characteristics are as follows: The maximum value DLm is 7.4 ns (frequency f1), and the maximum value DHm is 7.0 ns (frequency f2), with the difference (flatness) therebetween being 0.4 ns, which is greater than the value (0.2 ns) according to the first embodiment. The minimum value in the passband is 6.6 ns, and the group delay time deviation in the passband is 0.8 ns which is the same as the value according to the first embodiment.

In terms of the attenuation characteristics (b102) of the delay line 100A according to the first comparative example, the amount of attenuation in a capacitive range (low-frequency range) is greater than the amount of attenuation in an inductive range (high-frequency range), resulting in a gradual slope in the high-frequency range.

In terms of the attenuation characteristics (b101) shown in FIG. 2 according to the first embodiment, the amount of attenuation in a capacitive range (low-frequency range) and the amount of attenuation in an inductive range (high-frequency range) are substantially the same as each other, with steep slopes in the low-frequency range and the high-frequency range. The attenuation characteristics according to the first embodiment are better than the attenuation characteristics according to the first comparative example.

Figure 5:
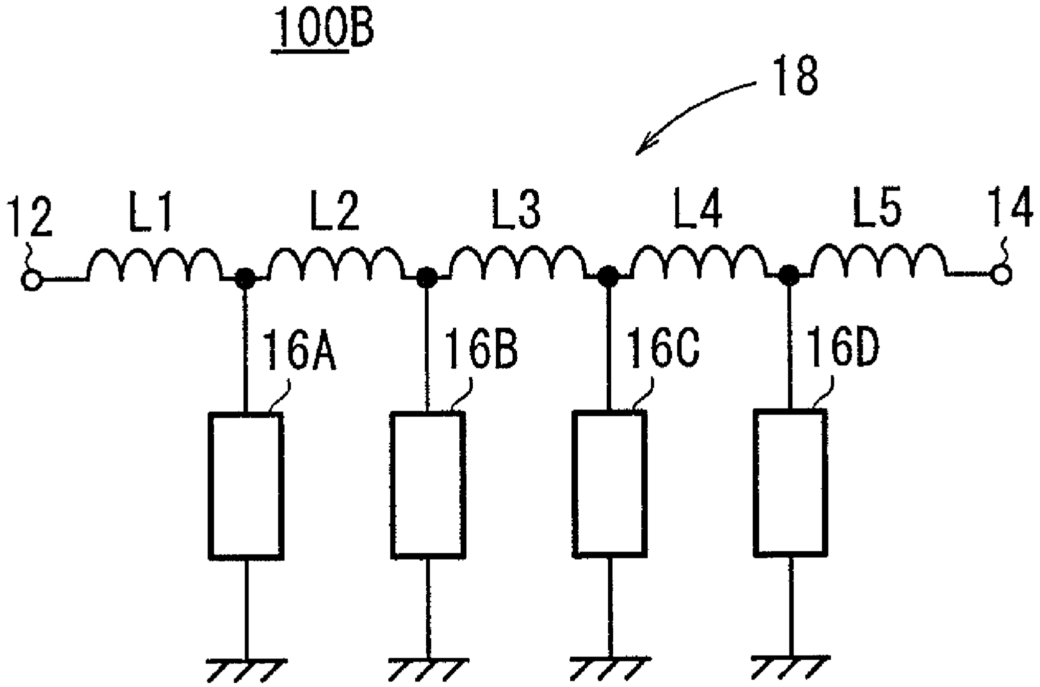
FIG. 5 is a circuit diagram showing a delay line according to a second comparative example.

As shown in FIG. 5, the delay line 100B according to the second comparative example includes a bandpass filter 18 wherein the input terminal 12 and the first resonator 16A, the fourth resonator 16D and the output terminal 14, and the first through fourth resonators 16A through 16D are induction-coupled by respective inductors L1, L2, L3, L4, L5.

Figure 6:
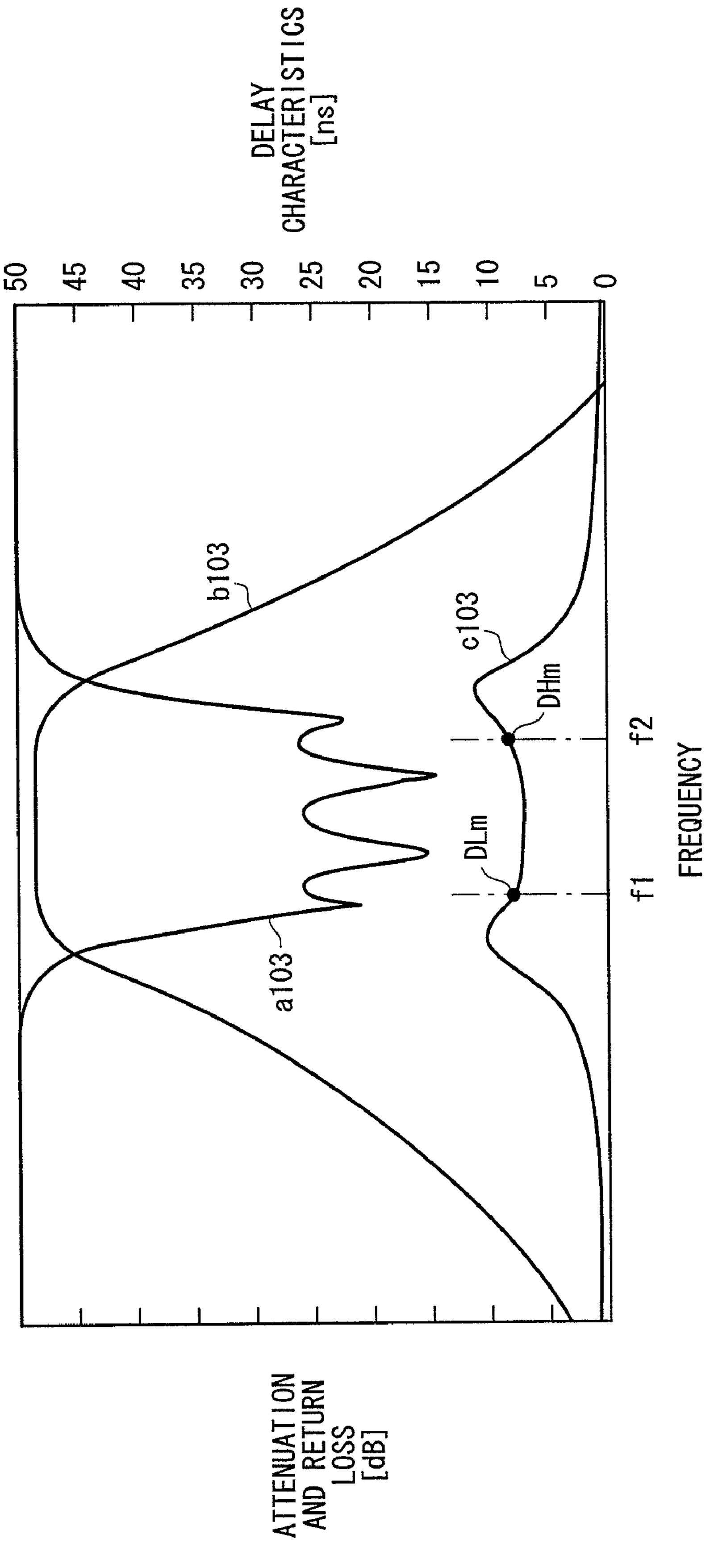
FIG. 6 is a diagram showing changes in the return loss with respect to the frequency, the attenuation characteristics, and the delay characteristics of the delay line according to the second comparative example.

FIG. 6 shows changes in the return loss with respect to the frequency, the attenuation characteristics, and the delay characteristics of the delay line 100B according to the second comparative example. In FIG. 6, a curve a103 represents changes in the return loss, a curve b103 the attenuation characteristics, and a curve c103 the delay characteristics.

Specific numerical values of the delay characteristics are as follows: The maximum value DLm is 7.3 ns (frequency f1), and the maximum value DHm is 7.9 ns (frequency f2), with the difference (flatness) therebetween being 0.6 ns, which is greater than the value (0.2 ns) according to the first embodiment. The minimum value in the passband is 6.9 ns, and the group delay time deviation in the passband is 1.0 ns which is greater than the value (0.8 ns) according to the first embodiment.

In terms of the attenuation characteristics (b103) of the delay line 100B according to the second comparative example, the amount of attenuation in an inductive range (high-frequency range) is greater than the amount of attenuation in a capacitive range (low-frequency range), resulting in a gradual slope in the low-frequency range.

In terms of the attenuation characteristics (b101) shown in FIG. 2 according to the first embodiment, both slopes in the low-frequency range and the high-frequency range are steep, and the attenuation characteristics are better than the attenuation characteristics according to the second comparative example.

It can be seen that the delay line 10A according to the first embodiment has good attenuation characteristics, the attenuation characteristics are symmetrical with respect to the central frequency, and the flatness of the group delay time in the passband in the delay characteristics is maintained. Since the flatness of the group delay time in the passband is maintained, the group delay time deviation in the passband is reduced.

A delay line 10B according to a second embodiment will be described below with reference to FIGS. 7 and 8.

Figure 7:
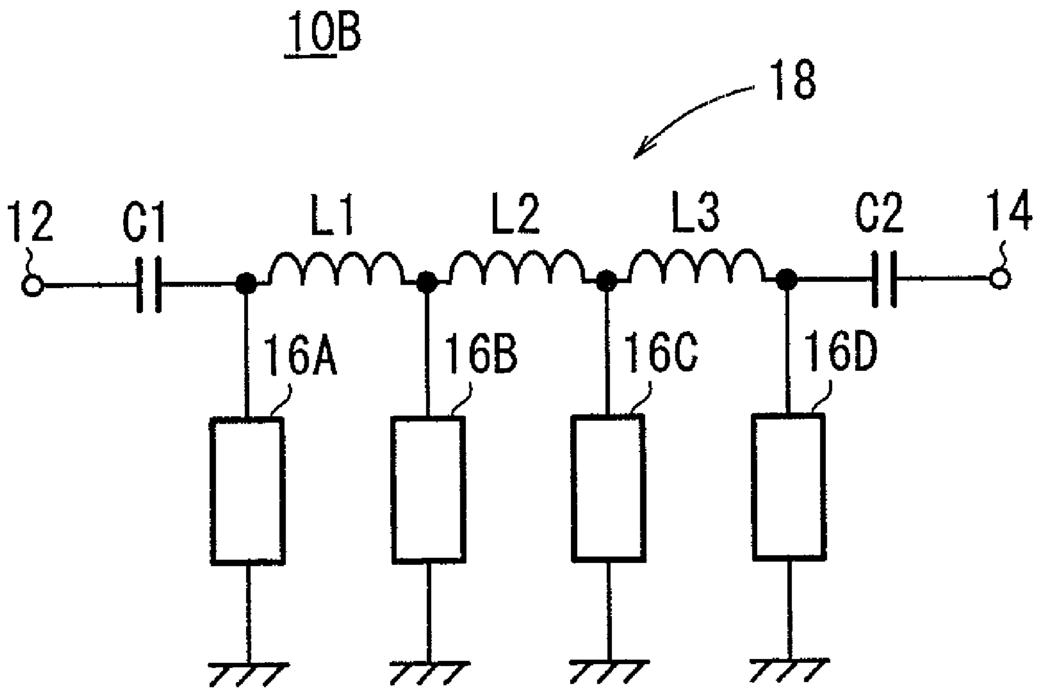
FIG. 7 is a circuit diagram showing a delay line according to a second embodiment.

As shown in FIG. 7, the delay line 10B according to the second embodiment is of substantially the same structure as the delay line 10A according to the first embodiment described above, but the bandpass filter 18 thereof is structurally different as follows:

In the bandpass filter 18, the input terminal 12 and the first resonator 16A, and the fourth resonator 16D and the output terminal 14 are coupled by respective capacitors C1, C2, and the first through fourth resonators 16A through 16D are induction-coupled by inductors L1, L2, L3. The combination of the two capacitive couplings (the capacitors C1, C2) and the three inductive couplings (the inductors L1 through L3) is symmetrically arranged.

Figure 8:
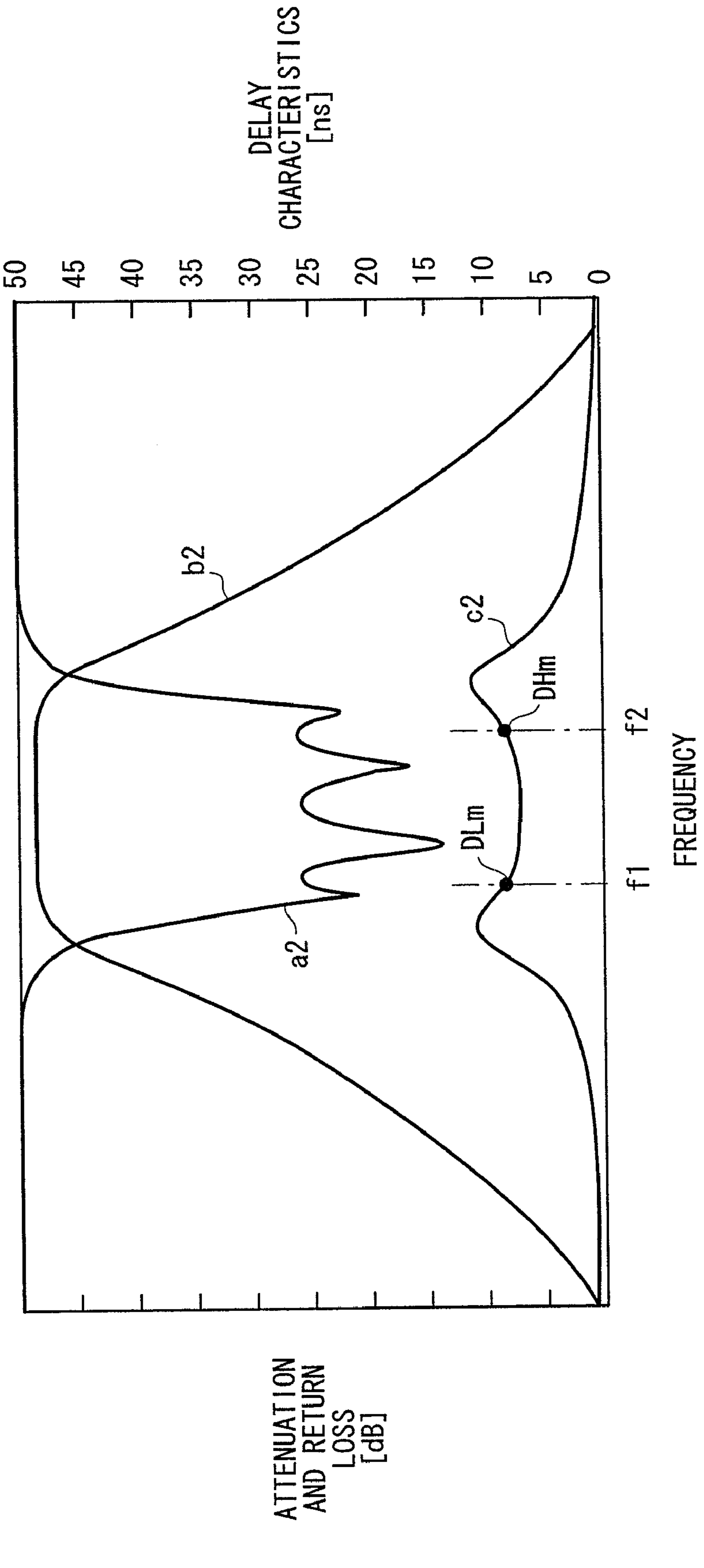
FIG. 8 is a diagram showing changes in the return loss with respect to the frequency, the attenuation characteristics, and the delay characteristics of the delay line according to the second embodiment.

FIG. 8 shows changes in the return loss with respect to the frequency, the attenuation characteristics, and the delay characteristics of the delay line 10B according to the second embodiment. In FIG. 8, a curve a2 represents changes in the return loss, a curve b2 the attenuation characteristics, and a curve c2 the delay characteristics.

Specific numerical values of the delay characteristics are as follows: The maximum value DLm is 7.4 ns (frequency f1), and the maximum value DHm is 7.5 ns (frequency f2), with the difference (flatness) therebetween being 0.1 ns. Since the minimum value in the passband is 6.8 ns, the group delay time deviation in the passband is 0.7 ns.

It can be seen that according to the second embodiment, the flatness of the group delay time in the passband is improved over the same according to the first embodiment.

A delay line 10C according to a third embodiment will be described below with reference to FIGS. 9 and 10.

Figure 9:
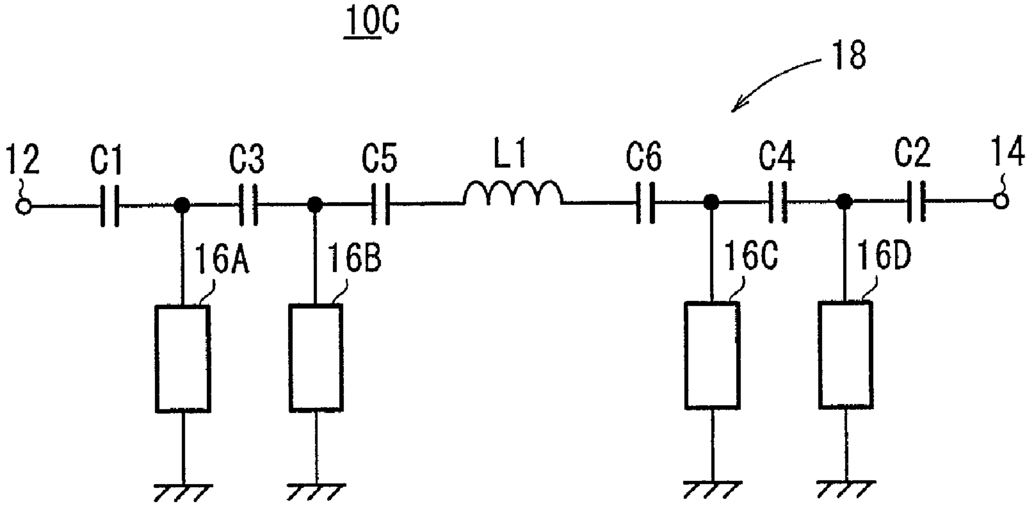
FIG. 9 is a circuit diagram showing a delay line according to a third embodiment.

As shown in FIG. 9, the delay line 10C according to the third embodiment is of substantially the same structure as the delay line 10A according to the first embodiment described above, but the bandpass filter 18 thereof is structurally different as follows:

In the bandpass filter 18, the input terminal 12 and the first resonator 16A, the fourth resonator 16D and the output terminal 14, the first resonator 16A and the second resonator 16B, and the third resonator 16C and the fourth resonator 16D are coupled by capacitors C1, C2, C3, C4, and the second resonator 16B and the third resonator 16C are coupled by a composite coupling configuration including capacitive couplings and an inductive coupling. The coupling configuration includes the coupling by a capacitor C5, the inductive coupling by an inductor L1, and the coupling by a capacitor C6 that are connected in series with each other. The combination of the six capacitive couplings (the capacitors C1 through C6) and the single inductive coupling (the inductor 11) is symmetrically arranged.

Figure 10:
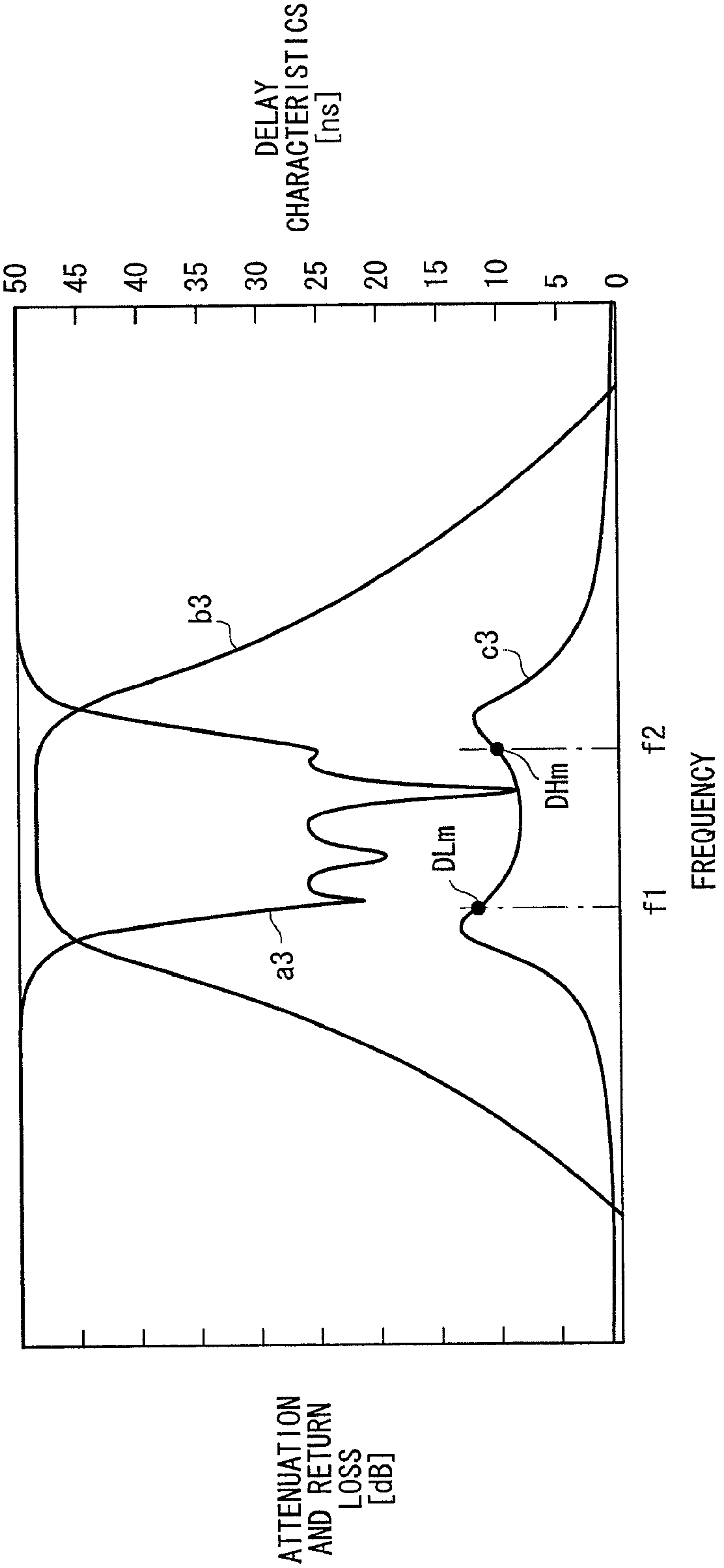
FIG. 10 is a diagram showing changes in the return loss with respect to the frequency, the attenuation characteristics, and the delay characteristics of the delay line according to the third embodiment.

FIG. 10 shows changes in the return loss with respect to the frequency, the attenuation characteristics, and the delay characteristics of the delay line 10C according to the third embodiment. In FIG. 10, a curve a3 represents changes in the return loss, a curve b3 the attenuation characteristics, and a curve c3 the delay characteristics.

Specific numerical values of the delay characteristics are as follows: The maximum value DLm is 9.7 ns (frequency f1), and the maximum value DHm is 9.3 ns (frequency f2), with the difference (flatness) therebetween being 0.4 ns. Since the minimum value in the passband is 8.3 ns, the group delay time deviation in the passband is 1.4 ns.

According to the third embodiment, the group delay time deviation in the passband is somewhat greater than the same according to the first embodiment. Since the minimum value in the passband is 8.3 ns, the third embodiment is advantageous if a large amount of delay is to be achieved.

A delay line 10D according to a fourth embodiment will be described below with reference to FIGS. 11 and 12.

Figure 11:
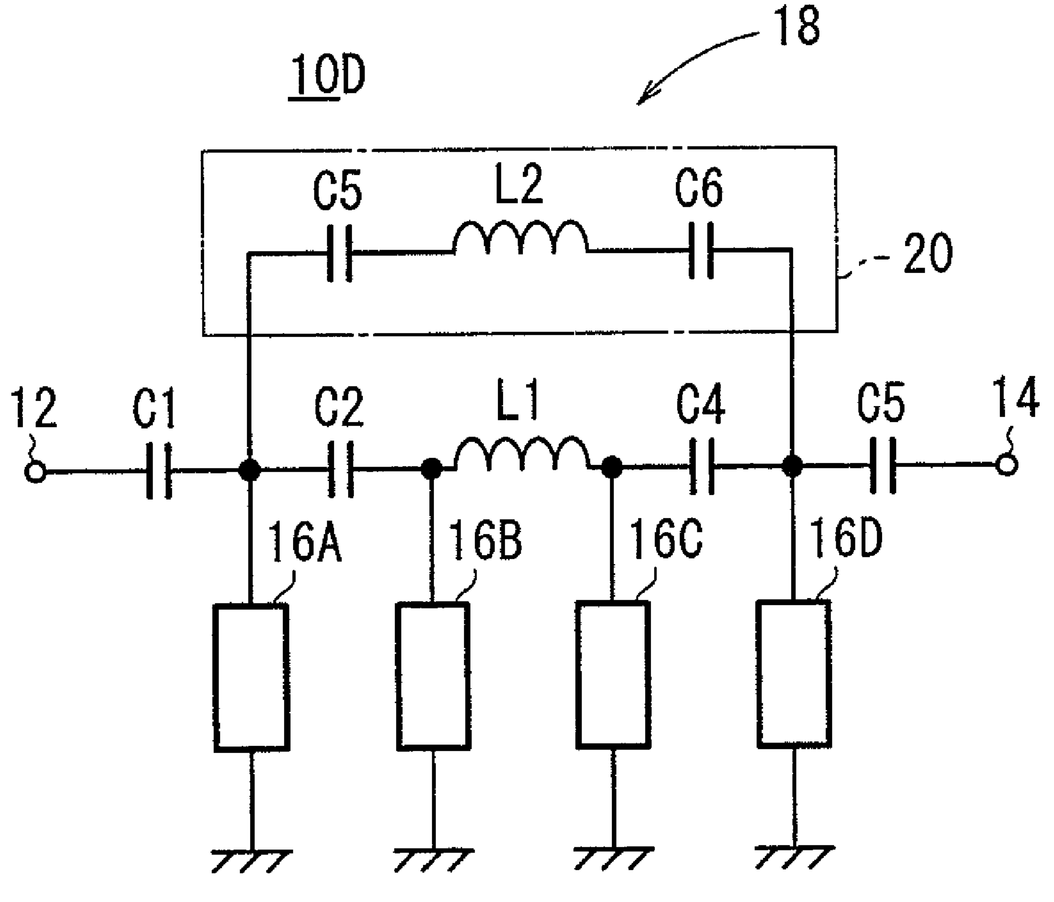
FIG. 11 is a circuit diagram showing a delay line according to a fourth embodiment.

As shown in FIG. 11, the delay line 10D according to the fourth embodiment is of substantially the same structure as the delay line 10A according to the first embodiment described above, but is different therefrom in that a circuit (skipping circuit 20) is connected parallel which connects the first resonator 16A and the fourth resonator 16D, among the first through fourth resonators 16A through 16D, in a composite coupling configuration including capacitive couplings and an inductive coupling across the second resonator 16B and the third resonator 16C. The coupling configuration of the skipping circuit 20 includes the coupling by a capacitor C5, the inductive coupling by an inductor L2, and the coupling by a capacitor C6 that are connected in series with each other.

Figure 12:
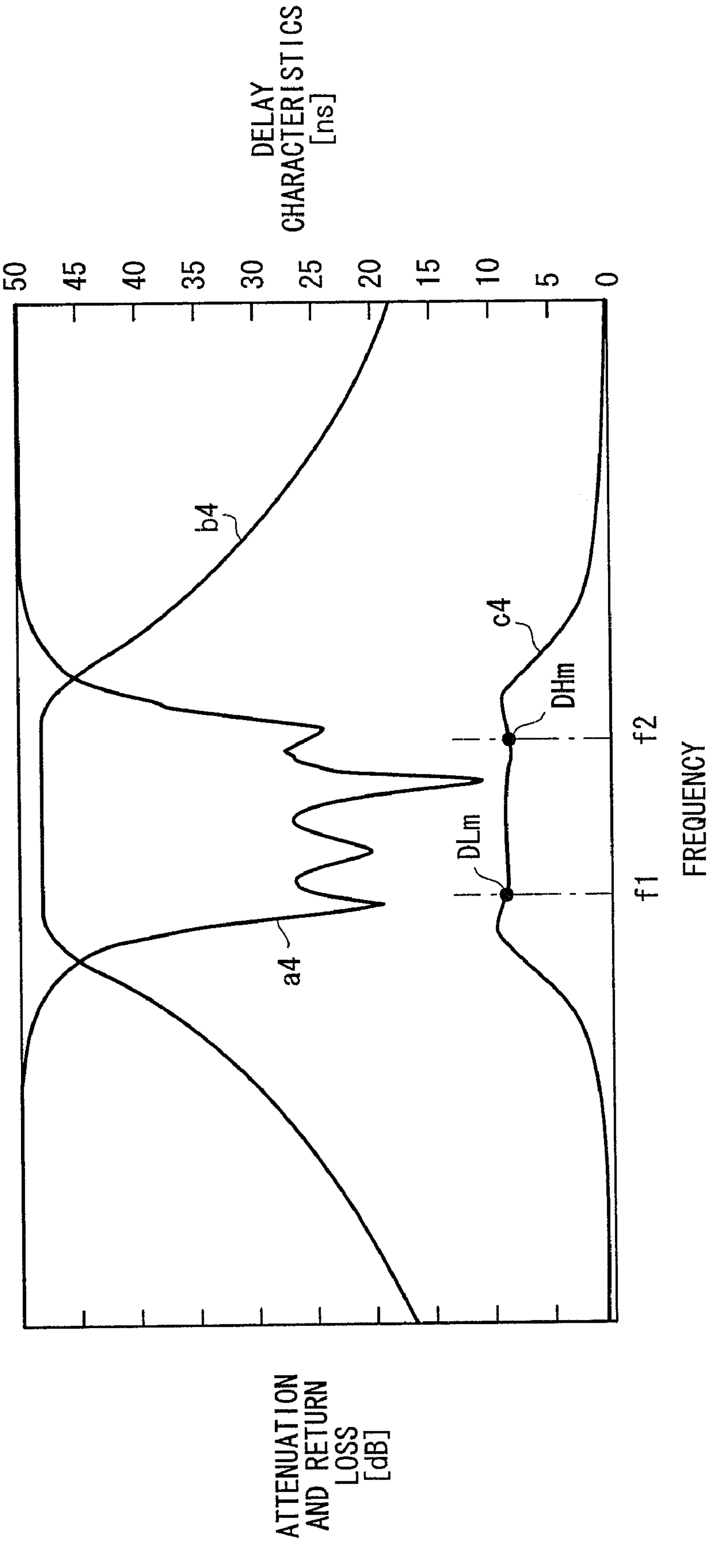
FIG. 12 is a diagram showing changes in the return loss with respect to the frequency, the attenuation characteristics, and the delay characteristics of the delay line according to the fourth embodiment.

FIG. 12 shows changes in the return loss with respect to the frequency, the attenuation characteristics, and the delay characteristics of the delay line 10D according to the fourth embodiment. In FIG. 12, a curve a4 represents changes in the return loss, a curve b4 the attenuation characteristics, and a curve c4 the delay characteristics.

Specific numerical values of the delay characteristics are as follows: The maximum value DLm is 8.8 ns (frequency f1), and the maximum value DHm is 8.5 ns (frequency f2), with the difference (flatness) therebetween being 0.3 ns. Since the minimum value in the passband is 8.5 ns, the group delay time deviation in the passband is 0.3 ns.

According to the fourth embodiment, the group delay time deviation in the passband is greatly improved over the same according to the first embodiment. Furthermore, a large amount of delay is achieved.

A delay line 10E according to a fifth embodiment will be described below with reference to FIGS. 13 and 14.

Figure 13:
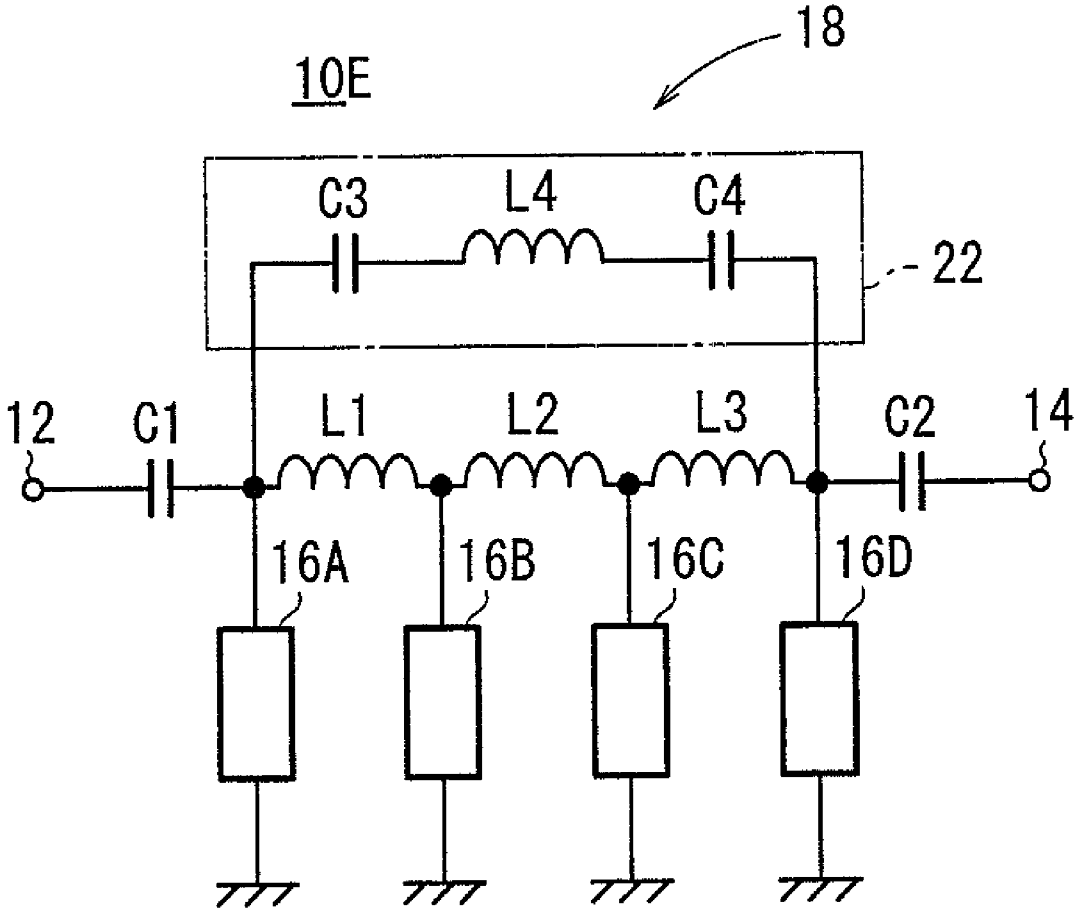
FIG. 13 is a circuit diagram showing a delay line according to a fifth embodiment.

As shown in FIG. 13, the delay line 10E according to the fifth embodiment is of substantially the same structure as the delay line 10B according to the second embodiment described above, but is different therefrom in that a circuit (skipping circuit 22) is connected parallel which connects the first resonator 16A and the fourth resonator 16D, among the first through fourth resonators 16A through 16D, in a composite coupling configuration including capacitive couplings and an inductive coupling across the second resonator 16B and the third resonator 16C. As with the fourth embodiment, the coupling configuration of the skipping circuit 22 includes the coupling by a capacitor C3, the inductive coupling by an inductor L4, and the coupling by a capacitor C4 that are connected in series with each other.

Figure 14:
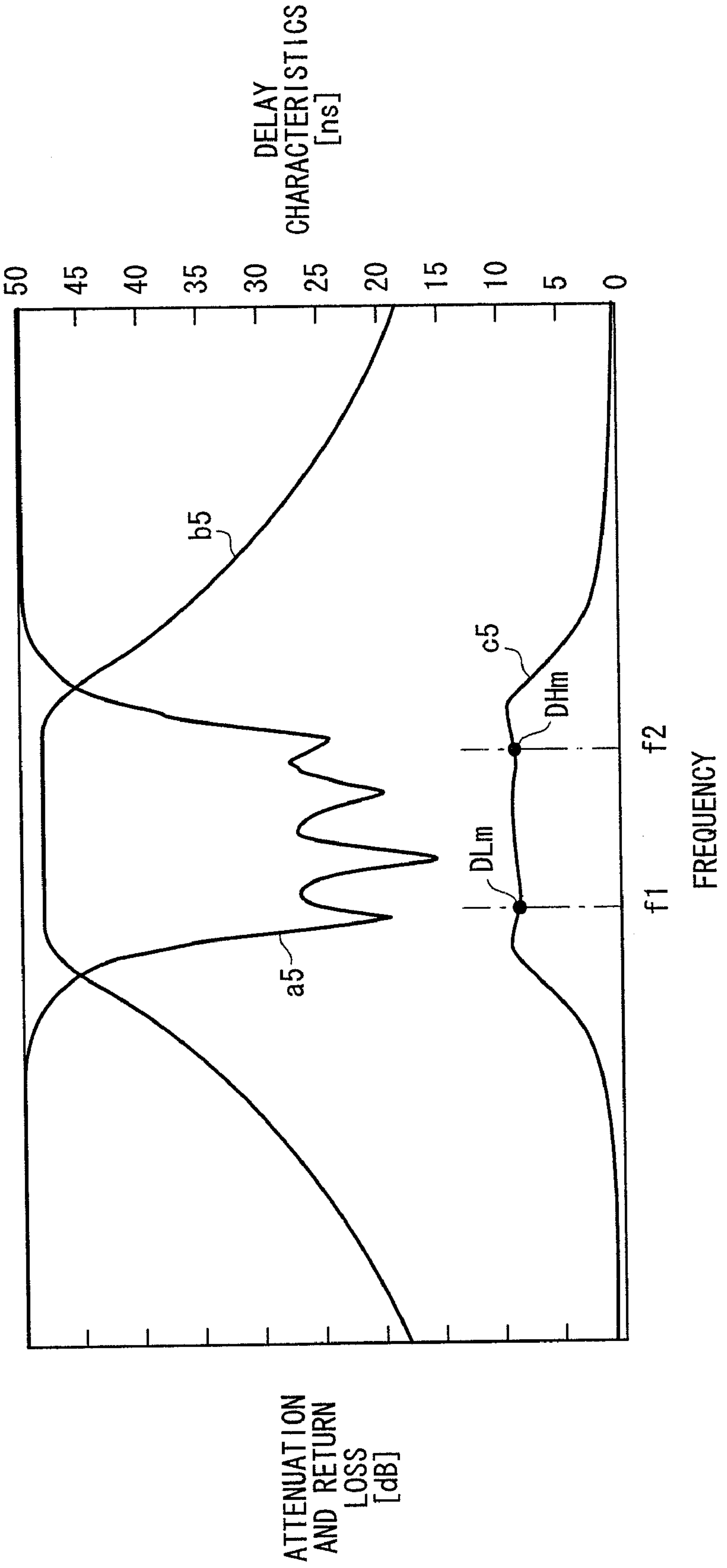
FIG. 14 is a diagram showing changes in the return loss with respect to the frequency, the attenuation characteristics, and the delay characteristics of the delay line according to the fifth embodiment.

FIG. 14 shows changes in the return loss with respect to the frequency, the attenuation characteristics, and the delay characteristics of the delay line 10E according to the fifth embodiment. In FIG. 14, a curve a5 represents changes in the return loss, a curve b5 the attenuation characteristics, and a curve c5 the delay characteristics.

Specific numerical values of the delay characteristics are as follows: The maximum value DLm is 8.5 ns (frequency f1), and the maximum value DHm is 9.0 ns (frequency f2), with the difference (flatness) therebetween being 0.5 ns. Since the minimum value in the passband is 8.5 ns, the group delay time deviation in the passband is 0.5 ns.

According to the fifth embodiment, the group delay time deviation in the passband is improved over the same according to the second embodiment. Furthermore, a large amount of delay is achieved.

A delay line 10F according to a sixth embodiment will be described below with reference to FIGS. 15 and 16.

Figure 15:
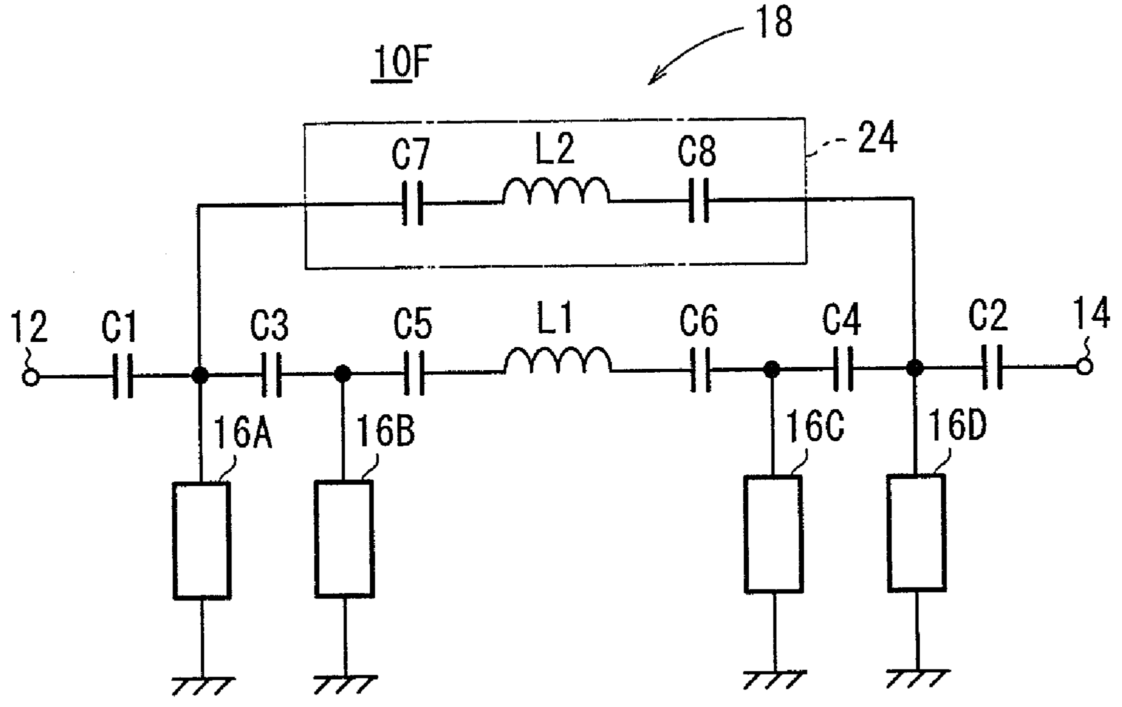
FIG. 15 is a circuit diagram showing a delay line according to a sixth embodiment.

As shown in FIG. 15, the delay line 10F according to the sixth embodiment is of substantially the same structure as the delay line 10C according to the third embodiment described above, but is different therefrom in that a circuit (skipping circuit 24) is connected parallel which connects the first resonator 16A and the fourth resonator 16D, among the first through fourth resonators 16A through 16D, in a composite coupling configuration including capacitive couplings and an inductive coupling across the second resonator 16B and the third resonator 16C. As with the fourth embodiment, the coupling configuration of the skipping circuit 24 includes the coupling by a capacitor C7, the inductive coupling by an inductor L2, and the coupling by a capacitor C8 that are connected in series with each other.

Figure 16:
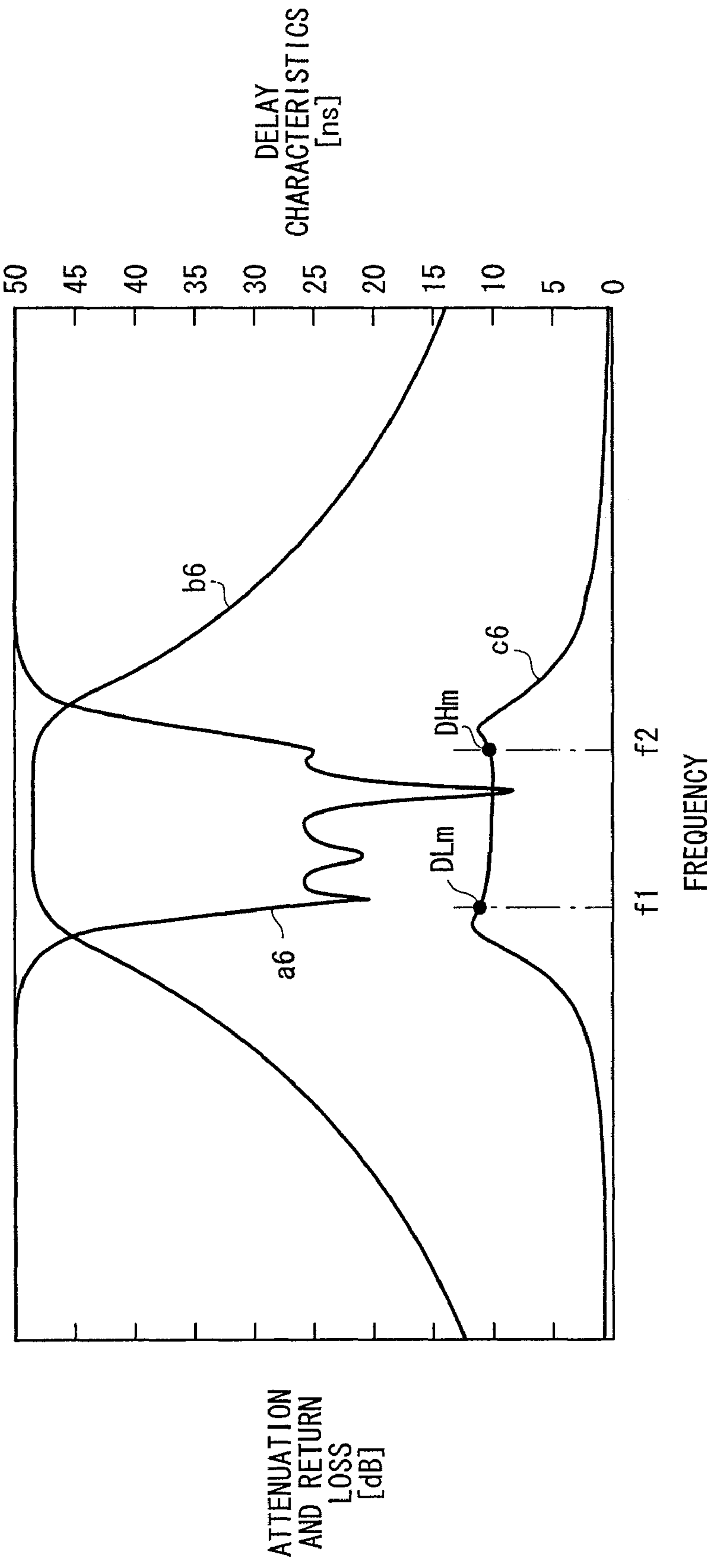
FIG. 16 is a diagram showing changes in the return loss with respect to the frequency, the attenuation characteristics, and the delay characteristics of the delay line according to the sixth embodiment.

FIG. 16 shows changes in the return loss with respect to the frequency, the attenuation characteristics, and the delay characteristics of the delay line 10F according to the sixth embodiment. In FIG. 16, a curve a6 represents changes in the return loss, a curve b6 the attenuation characteristics, and a curve c6 the delay characteristics.

Specific numerical values of the delay characteristics are as follows: The maximum value DLm is 10.3 ns (frequency f1), and the maximum value DHm is 10.0 ns (frequency f2), with the difference (flatness) therebetween being 0.3 ns. Since the minimum value in the passband is 9.9 ns, the group delay time deviation in the passband is 0.4 ns.

According to the sixth embodiment, the group delay time deviation in the passband is greatly improved over the same according to the third embodiment. Furthermore, a large amount of delay is achieved.

A delay line 10G according to a seventh embodiment will be described below with reference to FIGS. 17 and 18.

Figure 17:
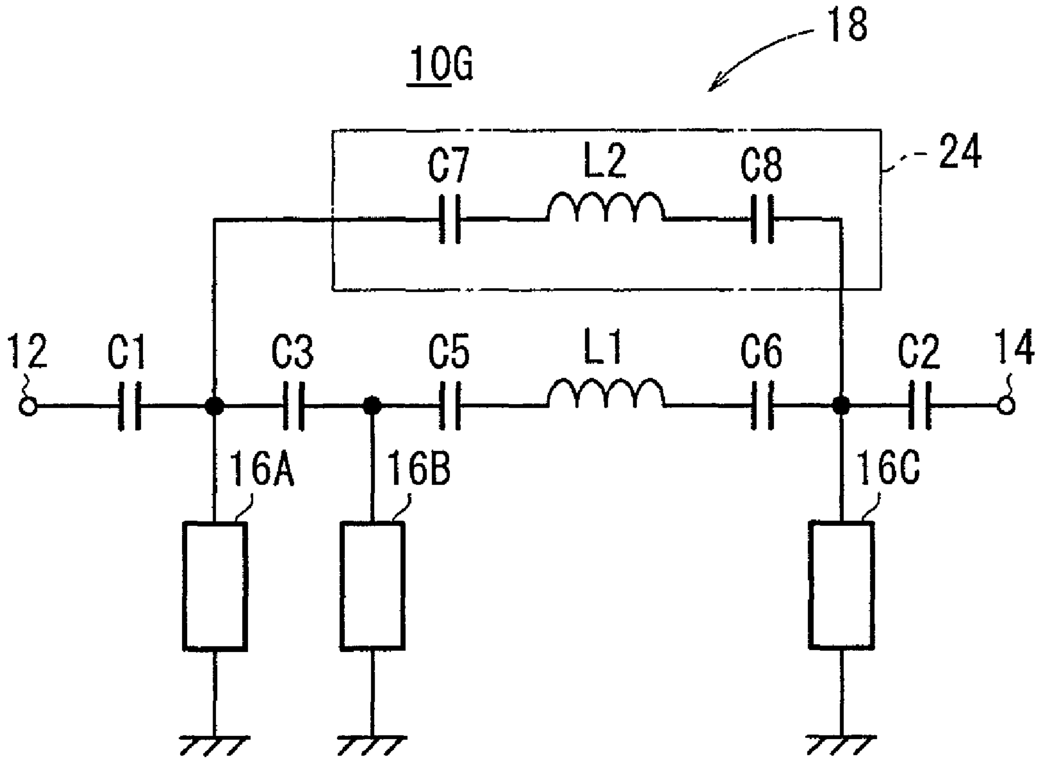
FIG. 17 is a circuit diagram showing a delay line according to a seventh embodiment.

As shown in FIG. 17, the delay line 10G according to the seventh embodiment is of substantially the same structure as the delay line 10F according to the sixth embodiment described above, but is different therefrom in that it has first through third resonators 16A through 16C and a circuit (skipping circuit 24) is connected parallel which connects the first resonator 16A and the third resonator 16C, among the first through third resonators 16A through 16C, in a composite coupling configuration including capacitive couplings and an inductive coupling across the second resonator 16B.

Figure 18:
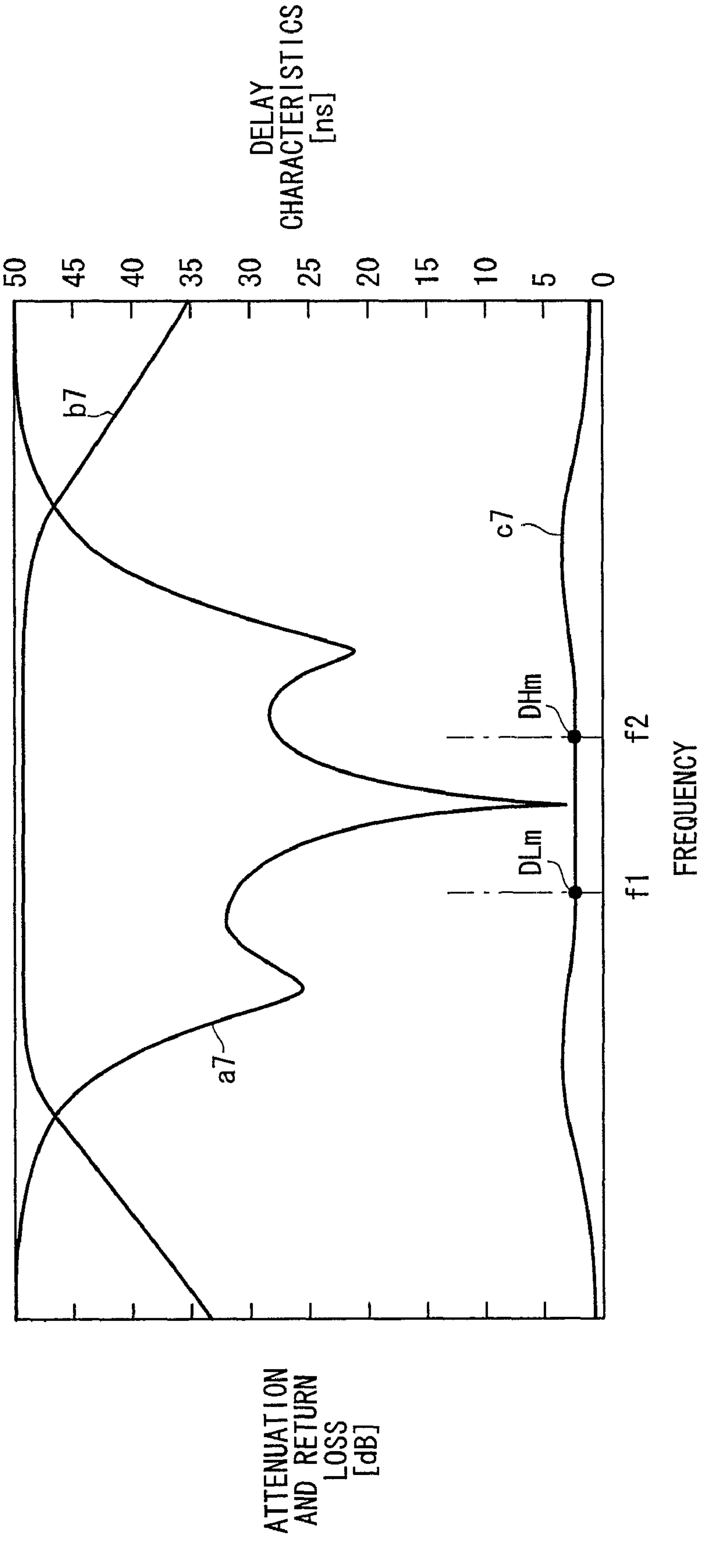
FIG. 18 is a diagram showing changes in the return loss with respect to the frequency, the attenuation characteristics, and the delay characteristics of the delay line according to the seventh embodiment.

FIG. 18 shows changes in the return loss with respect to the frequency, the attenuation characteristics, and the delay characteristics of the delay line 10G according to the seventh embodiment. In FIG. 18, a curve a7 represents changes in the return loss, a curve b7 the attenuation characteristics, and a curve c7 the delay characteristics.

Specific numerical values of the delay characteristics are as follows: The maximum value DLm is 2.4 ns (frequency f1), and the maximum value DHm is 2.4 ns (frequency f2), with the difference (flatness) therebetween being 0 ns. Since the minimum value in the passband is 2.4 ns, the group delay time deviation in the passband is 0.0 ns.

According to the seventh embodiment, the flatness of the group delay time in the passband and the group delay time deviation in the passband are greatly improved over the same according to the fourth and sixth embodiments.

Figure 19:
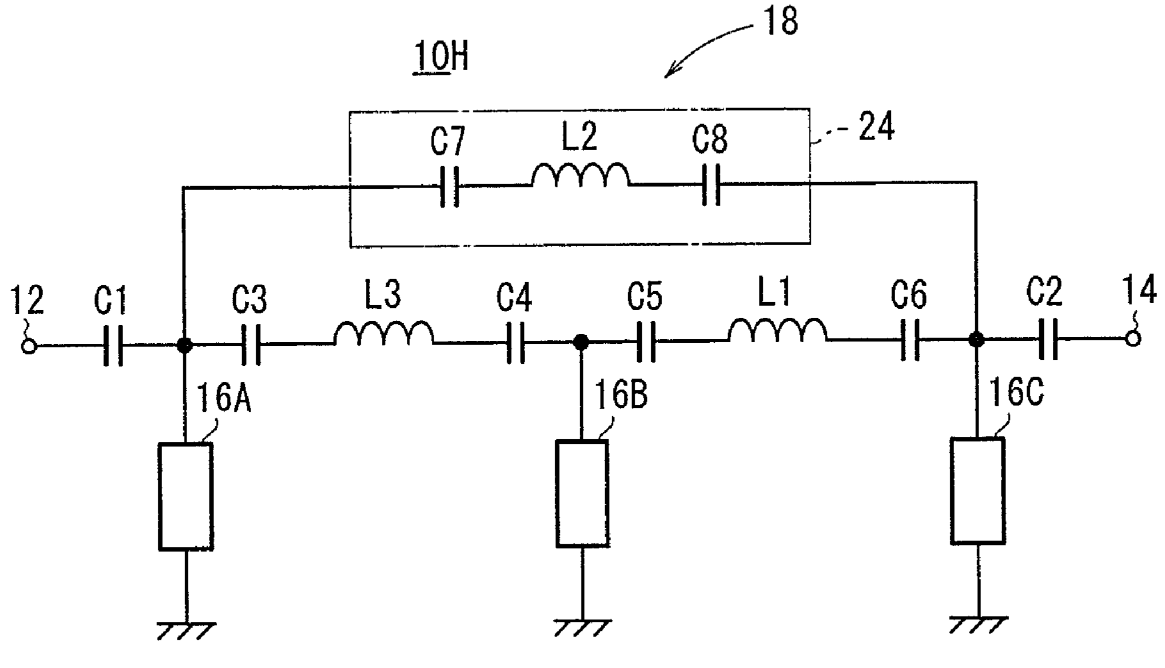
FIG. 19 is a circuit diagram showing a delay line according to an eighth embodiment.

A delay line 10H according to an eighth embodiment will be described below with reference to FIG. 19. As shown in FIG. 19, the delay line 10H according to the eighth embodiment is of substantially the same structure as the delay line 10G according to the seventh embodiment described above, but is different therefrom in that the first resonator 16A and the second resonator 16B are connected by a composite coupling configuration including the coupling by a capacitor C3, the inductive coupling by an inductor L3, and the coupling by a capacitor C4.

Figure 20:
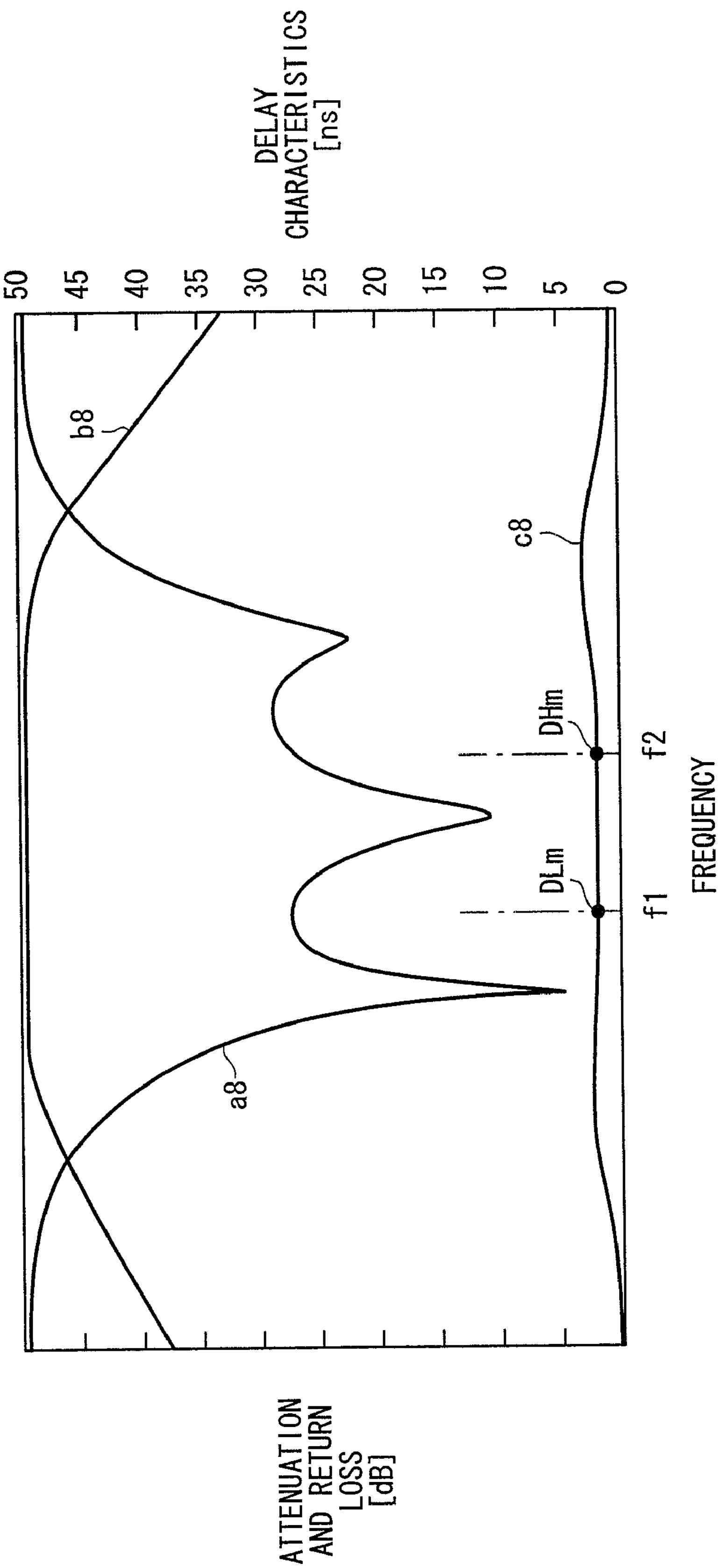
FIG. 20 is a diagram showing changes in the return loss with respect to the frequency, the attenuation characteristics, and the delay characteristics of the delay line according to the eighth embodiment.

FIG. 20 shows changes in the return loss with respect to the frequency, the attenuation characteristics, and the delay characteristics of the delay line 10H according to the eighth embodiment. In FIG. 20, a curve a8 represents changes in the return loss, a curve b8 the attenuation characteristics, and a curve c8 the delay characteristics.

Specific numerical values of the delay characteristics are as follows: The maximum value DLm is 2.2 ns (frequency f1), and the maximum value DHm is 2.3 ns (frequency f2), with the difference (flatness) therebetween being 0.1 ns. Since the minimum value in the passband is 2.2 ns, the group delay time deviation in the passband is 0.1 ns.

According to the eighth embodiment, the flatness in the passband and the group delay time deviation in the passband are greatly improved as with the seventh embodiment.

A delay line 10I according to a ninth embodiment will be described below with reference to FIGS. 21 and 22.

Figure 21:
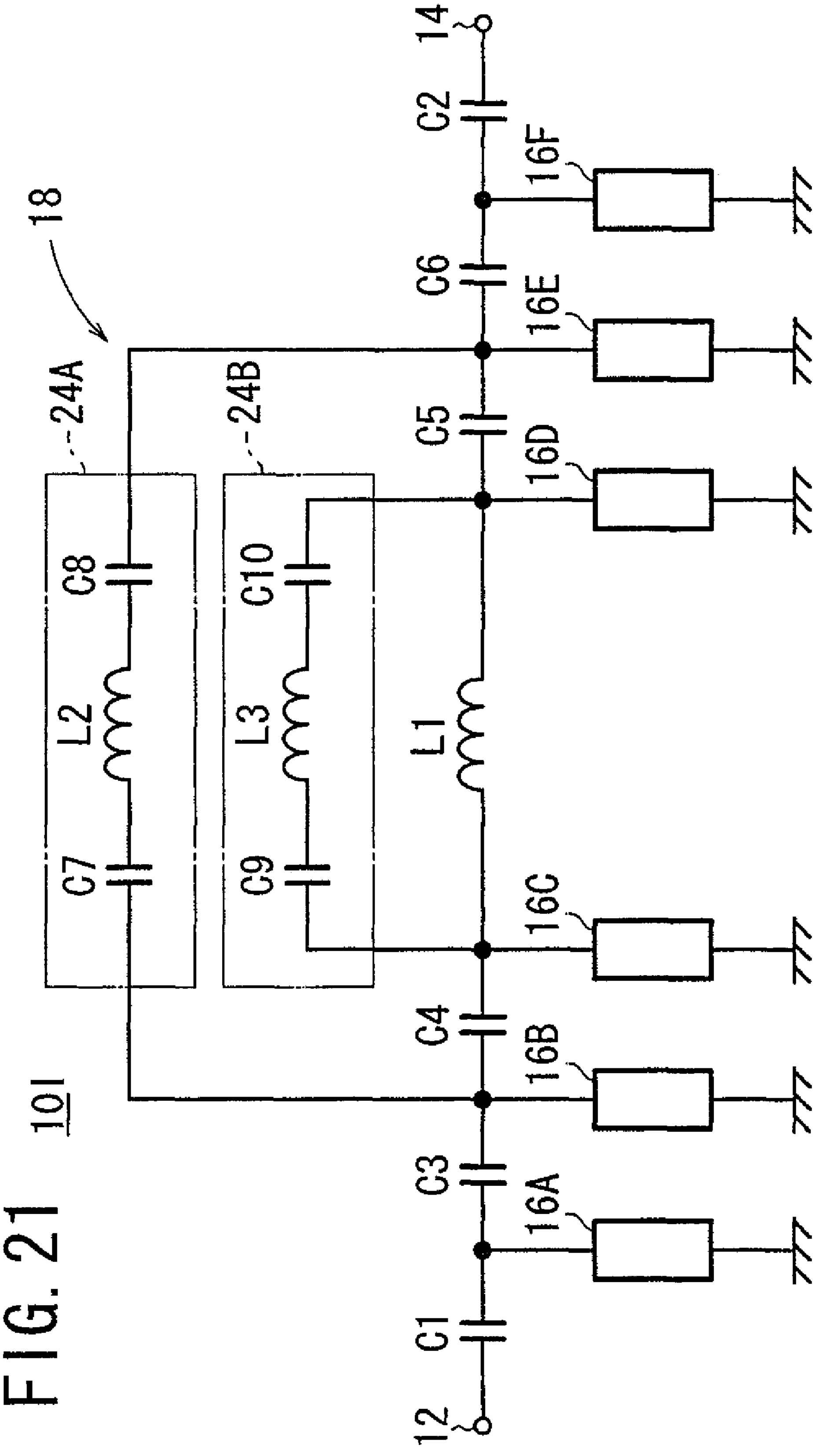
FIG. 21 is a circuit diagram showing a delay line according to a ninth embodiment.

As shown in FIG. 21, the delay line 10I according to the ninth embodiment is of substantially the same structure as the delay line 10D according to the fourth embodiment described above, but the bandpass filter 18 thereof is structurally different as follows:

The bandpass filter 18 has first through sixth resonators 16A through 16F. The input terminal 12 and the first resonator 16A, and the sixth resonator 16F and the output terminal 14 are coupled by respective capacitors C1, C2, and the first through third resonators 16A through 16C are capacity-coupled by capacitors C3, C4. The fourth through sixth resonators 16D through 16F are capacity-coupled by capacitors C5, C6, and the third and fourth resonators 16C, 16D are induction-coupled by an inductor L1.

In addition, a first skipping circuit 24A is connected parallel which connects the second resonator 16B and the fifth resonator 16E, among the first through sixth resonators 16A through 16F, in a composite coupling configuration including capacitive couplings and an inductive coupling, and a second skipping circuit 24B is connected parallel which connects the third resonator 16C and the fourth resonator 16D in a composite coupling configuration including capacitive couplings and an inductive coupling.

The coupling configuration of the first skipping circuit 24A includes the coupling by a capacitor C7, the inductive coupling by an inductor L2, and the coupling by a capacitor C8 that are connected in series with each other, and the coupling configuration of the second skipping circuit 24B includes the coupling by a capacitor C9, the inductive coupling by an inductor L3, and the coupling by a capacitor C10 that are connected in series with each other.

Figure 22:
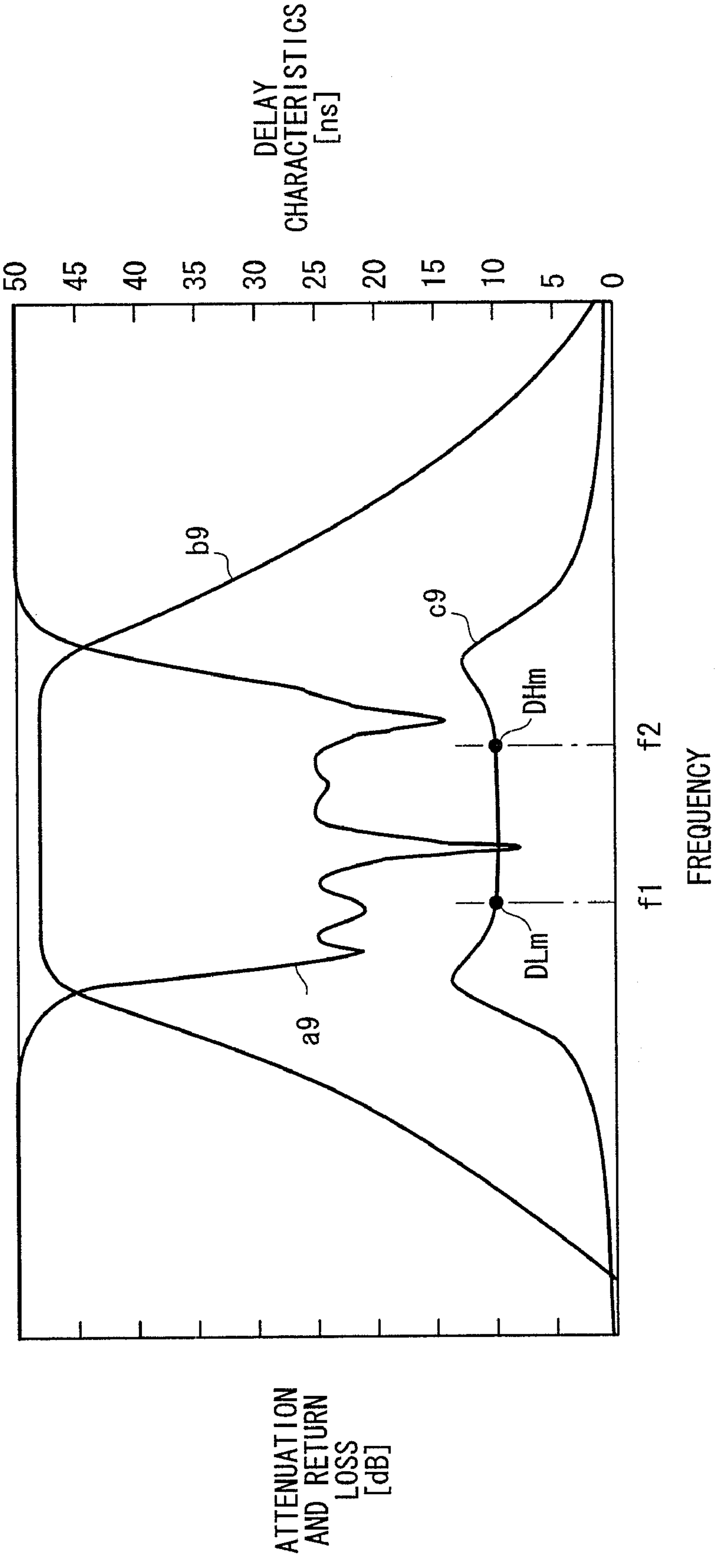
FIG. 22 is a diagram showing changes in the return loss with respect to the frequency, the attenuation characteristics, and the delay characteristics of the delay line according to the ninth embodiment.

FIG. 22 shows changes in the return loss with respect to the frequency, the attenuation characteristics, and the delay characteristics of the delay line 10I according to the ninth embodiment. In FIG. 22, a curve a9 represents changes in the return loss, a curve b9 the attenuation characteristics, and a curve c9 the delay characteristics.

Specific numerical values of the delay characteristics are as follows: The maximum value DLm is 10.6 ns (frequency f1), and the maximum value DHm is 11.2 ns (frequency f2), with the difference (flatness) therebetween being 0.6 ns. Since the minimum value in the passband is 10.6 ns, the group delay time deviation in the passband is 0.6 ns.

According to the ninth embodiment, the group delay time deviation in the passband is somewhat greater than the same according to the fourth embodiment. However, a large amount of delay is achieved.

A delay line 10J according to a tenth embodiment will be described below with reference to FIGS. 23 and 24.

Figure 23:
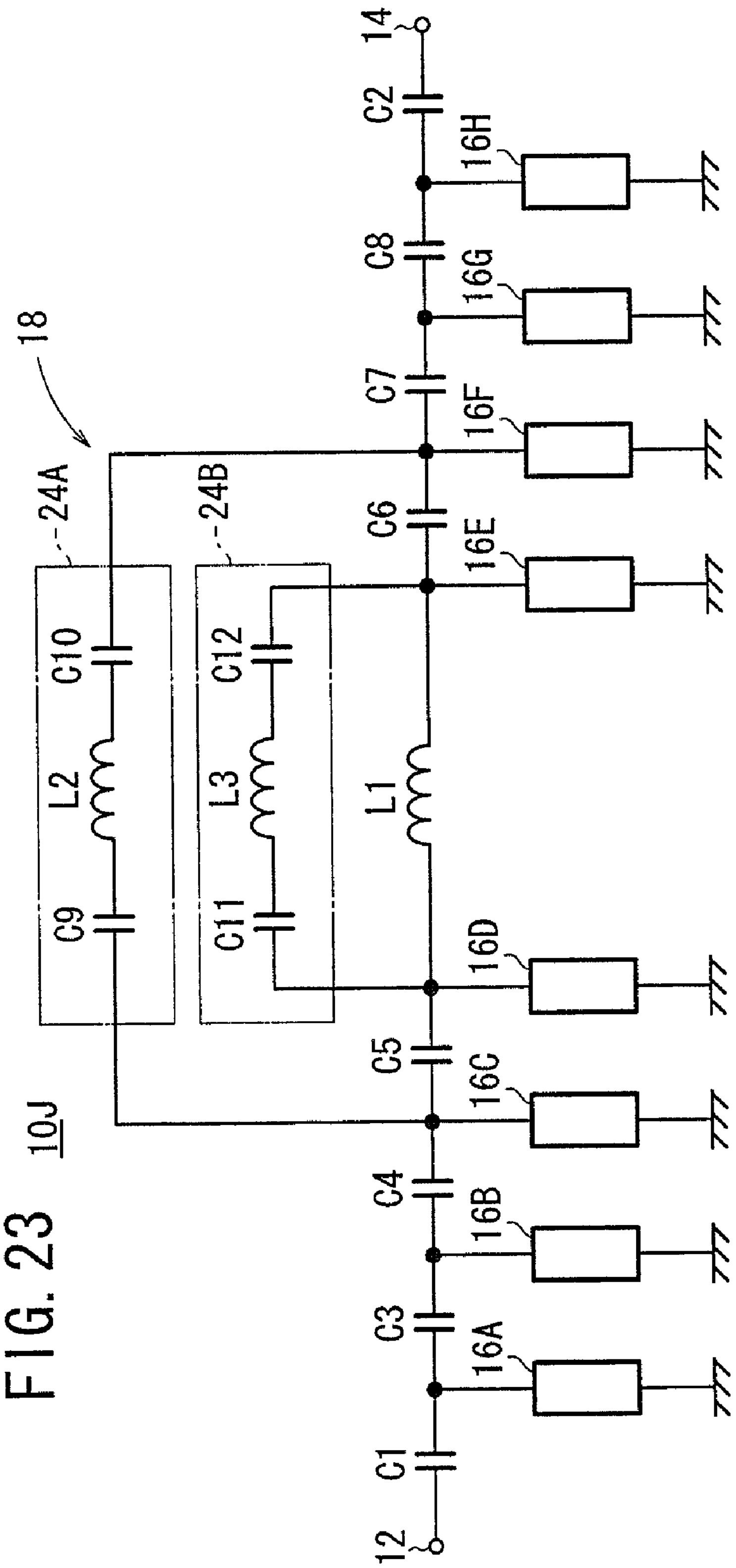
FIG. 23 is a circuit diagram showing a delay line according to a tenth embodiment.

As shown in FIG. 23, the delay line 10J according to the tenth embodiment is of substantially the same structure as the delay line 10I according to the ninth embodiment described above, but the bandpass filter 18 thereof is structurally different as follows:

The bandpass filter 18 has first through eighth resonators 16A through 16H. The input terminal 12 and the first resonator 16A, and the eighth resonator 16H and the output terminal 14 are coupled by respective capacitors C1, C2, and the first through fourth resonators 16A through 16D are capacity-coupled by capacitors C3, C4, C5. The fifth through eighth resonators 16E through 16H are capacity-coupled by capacitors C6, C7, C8, and the fourth and fifth resonators 16D, 16E are induction-coupled by an inductor L1.

In addition, a first skipping circuit 24A is connected parallel which connects the third resonator 16C and the sixth resonator 16F, among the first through eighth resonators 16A through 16H, and a second skipping circuit 24B is connected parallel which connects the fourth resonator 16D and the fifth resonator 16E.

The coupling configuration of the first skipping circuit 24A includes the coupling by a capacitor C9, the inductive coupling by an inductor L2, and the coupling by a capacitor C10 that are connected in series with each other, and the coupling configuration of the second skipping circuit 24B includes the coupling by a capacitor C11, the inductive coupling by an inductor L3, and the coupling by a capacitor C12 that are connected in series with each other.

Figure 24:
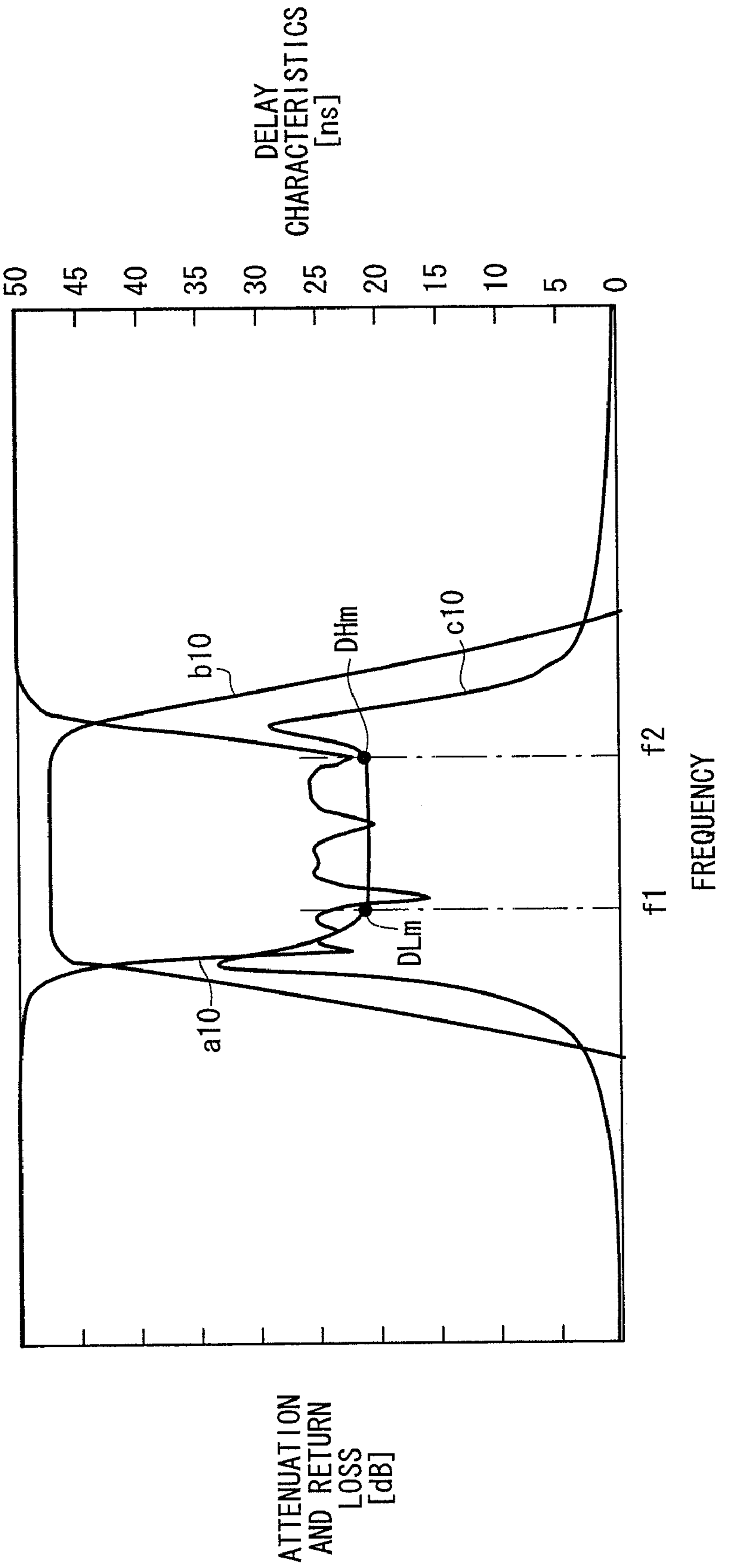
FIG. 24 is a diagram showing changes in the return loss with respect to the frequency, the attenuation characteristics, and the delay characteristics of the delay line according to the tenth embodiment.

FIG. 24 shows changes in the return loss with respect to the frequency, the attenuation characteristics, and the delay characteristics of the delay line 10J according to the tenth embodiment. In FIG. 24, a curve a10 represents changes in the return loss, a curve b10 the attenuation characteristics, and a curve c10 the delay characteristics.

Specific numerical values of the delay characteristics are as follows: The maximum value DLm is 20.6 ns (frequency f1), and the maximum value DHm is 20.8 ns (frequency f2), with the difference (flatness) therebetween being 0.2 ns. Since the minimum value in the passband is 19.9 ns, the group delay time deviation in the passband is 0.9 ns.

According to the tenth embodiment, the group delay time deviation in the passband is somewhat greater than the same according to the ninth embodiment. Since the minimum value in the passband is 19.9 ns, the tenth embodiment is advantageous if a large amount of delay is to be achieved. Particularly, since the slopes of the attenuation characteristics in the low-frequency range and the high-frequency range are steeper than those according to the ninth embodiment, the tenth embodiment is advantageous if signals outside the passband are to be suppressed.

A delay line 10K according to an eleventh embodiment will, be described below with reference to FIGS. 25 and 26.

Figure 25:
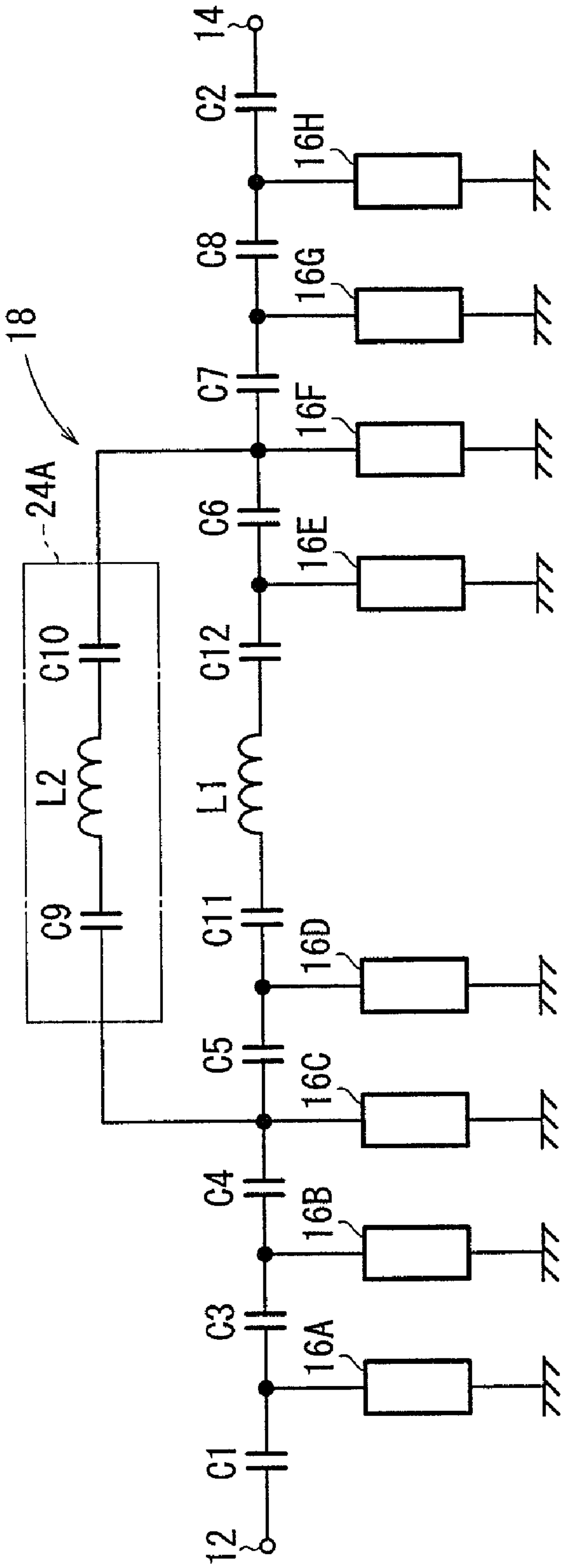
FIG. 25 is a circuit diagram showing a delay line according to an eleventh embodiment.

As shown in FIG. 25, the delay line 10K according to the eleventh embodiment is of substantially the same structure as the delay line 10J according to the tenth embodiment described above, but the bandpass filter 18 thereof is structurally different as follows:

The bandpass filter 18 is devoid of the second skipping circuit 24B, and has the fourth resonator 16D and the fifth resonator 16E connected by a composite coupling configuration including capacitive couplings and an inductive coupling. The coupling configuration includes the coupling by a capacitor C1, the inductive coupling by an inductor L1, and the coupling by a capacitor C12 that are connected in series with each other.

Figure 26:
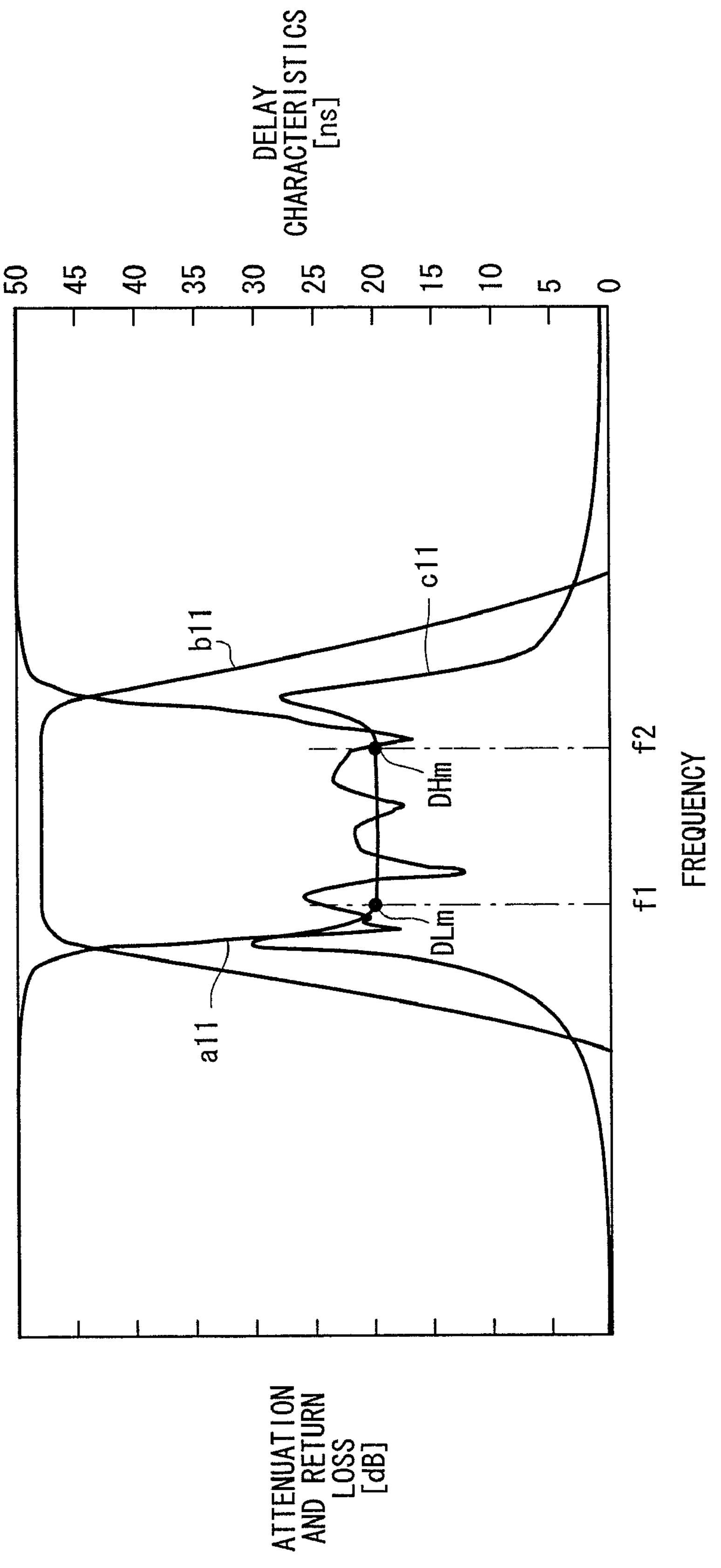
FIG. 26 is a diagram showing changes in the return loss with respect to the frequency, the attenuation characteristics, and the delay characteristics of the delay line according to the eleventh embodiment.
Figure 27:
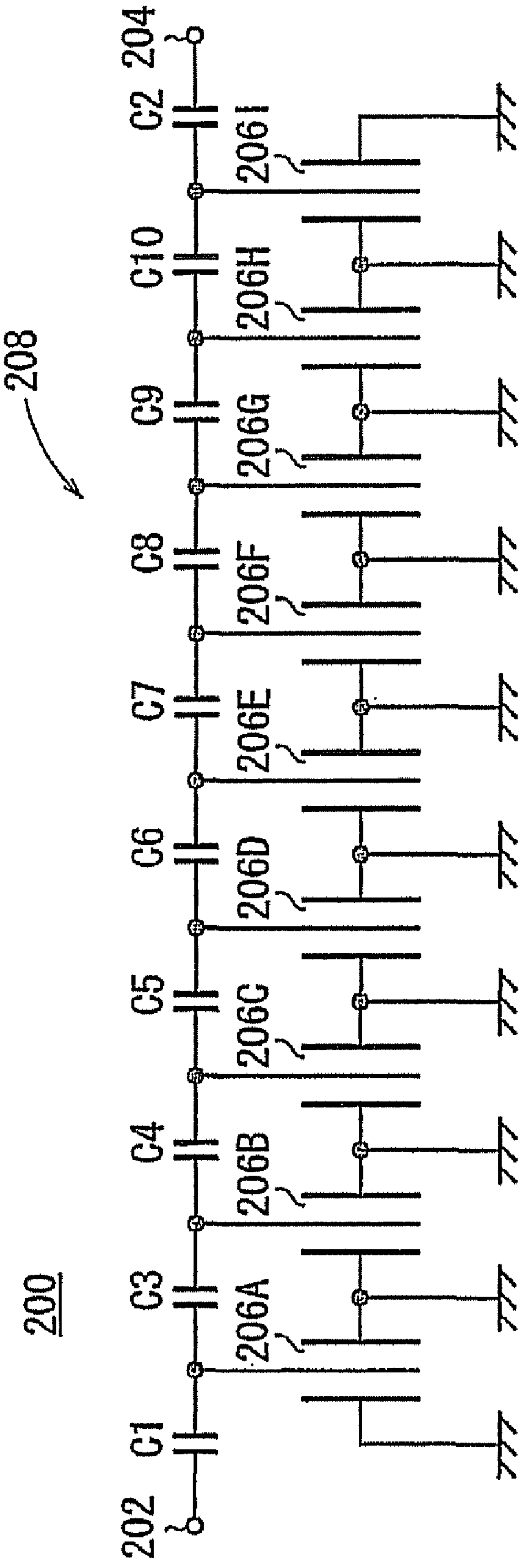
FIG. 27 PRIOR ART
FIG. 27 is a diagram showing a conventional delay line.
Figure 28:
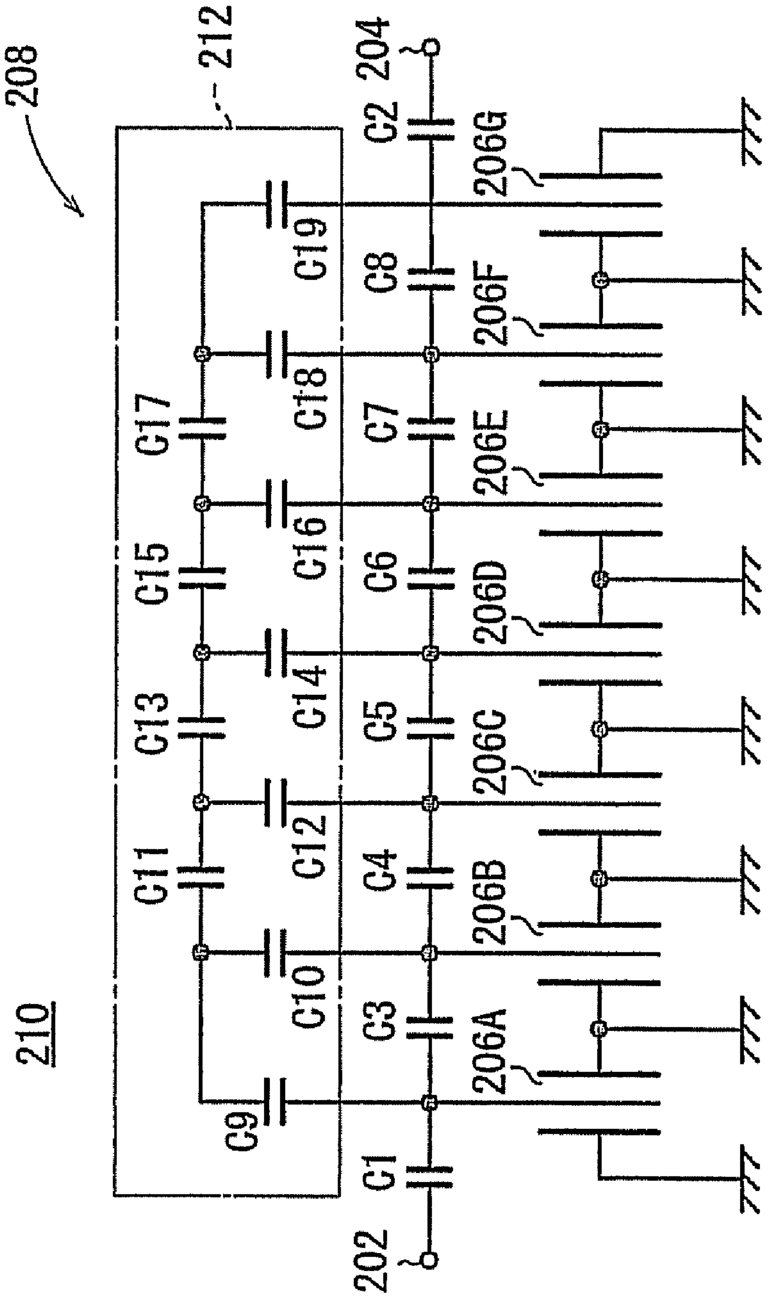
FIG. 28 PRIOR ART
FIG. 28 is a diagram showing another conventional delay line.
Figure 29:
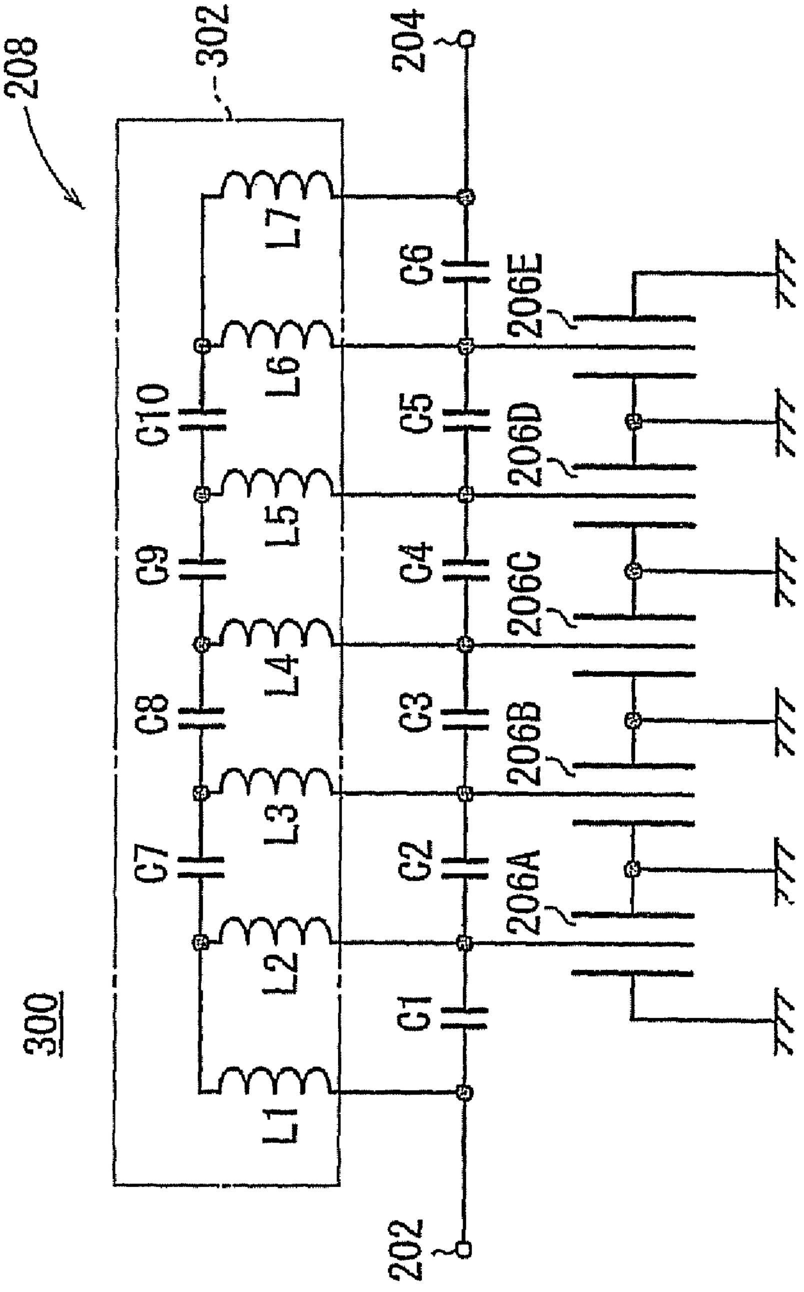
FIG. 29 PRIOR ART
FIG. 29 is a diagram showing still another conventional delay line.

FIG. 26 shows changes in the return loss with respect to the frequency, the attenuation characteristics, and the delay characteristics of the delay line 10K according to the eleventh embodiment. In FIG. 26, a curve all represents changes in the return loss, a curve b11 the attenuation characteristics, and a curve c11 the delay characteristics.

Specific numerical values of the delay characteristics are as follows: The maximum value DLm is 19.4 ns (frequency f1), and the maximum value DHm is 19.3 ns (frequency f2), with the difference (flatness) therebetween being 0.1 ns. Since the minimum value in the passband is 19.3 ns, the group delay time deviation in the passband is 0.1 ns.

According to the eleventh embodiment, as with the seventh and eighth embodiments, the flatness in the passband and the group delay time deviation in the passband are greatly improved. Furthermore, a large amount of delay is achieved. As with the tenth embodiment described above, since the slopes of the attenuation characteristics in the low-frequency range and the high-frequency range are steeper than those according to the ninth embodiment, the eleventh embodiment is advantageous if signals outside the passband are to be suppressed.

The delay line according to the present invention is not limited to the above embodiments, but may have various structures without departing from the scope of the present invention.

The invention claimed is:

1. A delay line including a bandpass filter which has a plurality of resonators between an input terminal and an output terminal, wherein said input terminal and one of said resonators which is adjacent to said input terminal are connected to each other by a capacitive coupling or an inductive-coupling;

said output terminal and one of said resonators which is adjacent to said output terminal are connected to each other by a capacitive coupling or an inductive-coupling;

at least one pair of adjacent resonators of said resonators are connected to each other by a capacitive coupling and an inductive-coupling in series;

and said delay line further comprising at least one additional circuit connecting two of said plurality of resonators across at least one resonator of said plurality of resonators, by a composite coupling configuration including at least one capacitive coupling and at least one inductive coupling that are connected in series with each other.

2. A delay line according to claim 1, wherein each of said plurality of resonators comprises one of a λ/4 resonator, a λ/2 resonator, and an LC resonance circuit.

* * * * *